(12) United States Patent
Akanuma et al.

(10) Patent No.: US 8,395,834 B2
(45) Date of Patent: Mar. 12, 2013

(54) DEFLECTING MIRROR FOR DEFLECTING AND SCANNING LIGHT BEAM

(75) Inventors: Goichi Akanuma, Yokohama (JP);
Tomofumi Kitazawa, Kawasaki (JP);
Fumiko Sakoh, Yokohama (JP)

(73) Assignee: Ricoh Company, Limited, Tokyo (JP)

( * ) Notice: Subject to any disclaimer, the term of this patent is extended or adjusted under 35 U.S.C. 154(b) by 596 days.

(21) Appl. No.: 12/695,522

(22) Filed: Jan. 28, 2010

(65) Prior Publication Data
US 2010/0195180 A1 Aug. 5, 2010

(30) Foreign Application Priority Data

Jan. 30, 2009 (JP) ................................. 2009-020335
Nov. 9, 2009 (JP) ................................. 2009-256271

(51) Int. Cl.
*G02B 26/08* (2006.01)
(52) U.S. Cl. ............... 359/200.8; 359/199.4; 359/221.2; 359/223.1; 359/224.1
(58) Field of Classification Search ............... 359/199.1, 359/199.4, 200.8, 221.2, 223.1–226.2; 310/311, 310/330–332
See application file for complete search history.

(56) References Cited

U.S. PATENT DOCUMENTS 5,579,148 A 11/1996 Nishikawa et al.
2007/0146858 A1* 6/2007 Matsuda ........................ 359/224
2009/0185254 A1 7/2009 Uchigaki et al.
2009/0284818 A1* 11/2009 Maekawa .................... 359/221.2

FOREIGN PATENT DOCUMENTS

| JP | 7-199099 | 8/1995 |
| JP | 2008-83603 | 4/2008 |
| JP | 2009-150793 | 7/2009 |

* cited by examiner

*Primary Examiner* — James Phan
(74) *Attorney, Agent, or Firm* — Oblon, Spivak, McClelland, Maier & Neustadt, L.L.P.

(57) ABSTRACT

The deflecting mirror includes a fixed base member; a mirror having a reflection surface; a support member swingablly supporting the mirror; a pair of driving beam members, each having a first end connected with the fixed base member and a second end connected with the support member to support the support member from both sides; and a piezoelectric member fixed to each driving beam member and extending from the first or second end of each driving beam member while having length not longer than about half the length of the driving beam member. The piezoelectric member and the driving beam members constitute piezoelectric unimorph or bimorph structure. By applying voltage to the piezoelectric member, the driving beam members are driven at the same time in the same direction, thereby vibrating the support member in a direction perpendicular to the reflection surface of the mirror, resulting in swinging of the mirror.

7 Claims, 34 Drawing Sheets

UNDER T1 CONDITION

UNDER T2 CONDITION

UNDER T1 CONDITION

UNDER T2 CONDITION

UNDER T1 CONDITION

UNDER T2 CONDITION

UNDER T1 CONDITION

UNDER T2 CONDITION

DEFLECTING MIRROR FOR DEFLECTING AND SCANNING LIGHT BEAM

BACKGROUND OF THE INVENTION

1. Field of the Invention

The present invention relates to a deflecting mirror configured to deflect and scan a light beam such as laser beams. In addition, the present invention relates to an optical scanning device, an image forming apparatus, and image projecting apparatus, which are equipped with the deflecting mirror.

2. Discussion of the Background

Deflecting mirrors are broadly used for various devices such as optical scanning devices, image forming apparatus, image projecting apparatus, barcode scanners, and laser radars. An electrostatic force, electromagnetic force or piezoelectric force is used for driving such deflection mirrors.

Deflecting mirrors using an electrostatic force use a parallel-plate electrode or a comb-shaped electrode. With recent improvements in fine processing technology, comb-shaped electrodes can generate a relatively large force. However, a desirable light deflection angle cannot be obtained even by a deflecting mirror using such an improved comb-shaped electrode. Therefore, it is necessary to apply a high voltage for driving the deflecting mirror. Increasing the driving voltage for a deflecting mirror causes problems such that the parts of the electric source used for the deflecting mirror become large in size; and costs of the deflecting mirror increase.

Deflecting mirrors using an electromagnetic force have to use a permanent magnet, which is to be arranged outside the mirrors. Therefore, the deflecting mirrors have complex configuration (i.e., poor productivity), thereby making it impossible to miniaturize the deflecting mirrors. Recently, investigation on deflecting mirrors using a magnetostrictive film has been made. However, since such a magnetostrictive film has poor magnetic properties, the resultant deflecting mirror has poor deflection properties. In addition, a problem in that when a current is flown in the coil, an excessive amount of heat is generated, resulting in increase of electric consumption is caused.

Deflecting mirrors using a piezoelectric force can generate a large force even by a small electric power although the deflecting mirrors need a relatively large driving voltage. Although deflecting mirrors using a piezoelectric force can generate a large force, the degree of distortion of the mirrors is small. In attempting to enhance the distortion, piezoelectric devices having a unimorph or bimorph structure such that a piezoelectric material and an elastic beam-like member are overlaid to change a small degree of in-plane distortion caused by piezoelectricity to a relatively large degree of warping have been investigated.

Published unexamined Japanese patent applications Nos. (hereinafter referred to as JP-As) 07-199099 (corresponding to U.S. Pat. No. 5,579,148) and 2008-83603 (corresponding to published US application No. 20090185254) have disclosed deflecting mirrors having a piezoelectric unimorph structure.

JP-A 2008-83603 discloses a technique in that a piezoelectric body having a specific length is arranged only on one side (fixing portion side) of a beam portion of a frame portion, and two beam portions (hereinafter referred to as driving beam portions) located on both sides of a connection point of the mirror supporting portion with the frame portion are driven in the opposed directions (i.e., reversed-phase driving), thereby imparting a moment thereto. Namely, since the two driving beam portions are driven in the opposite directions, both the movements of the driving beam portions are limited, resulting in deterioration of driving efficiency.

Thus, the optical scanning element disclosed in JP-A 2008-83603, in which a piezoelectric body is arranged on a portion of one side (fixing portion side) of a driving beam portion, has poor driving efficiency.

Because of these reasons, a need exists for an optical scanning element (deflecting mirror) in which a mirror can be deformed at a large angular amplitude even by a relatively low driving voltage.

SUMMARY OF THE INVENTION

As an aspect of the present invention, a deflecting mirror is provided. The deflecting mirror includes:
a fixed base member;
a mirror having a reflection surface;
a support member configured to swingably support the mirror;
a pair of driving beam members, each of which has a first end connected with the fixed base member and a second end connected with the support member to support the support member from both sides thereof; and
a piezoelectric member fixed to each of the driving beam members and extending from the first or second end of the driving beam member while having a length not longer than about half the length of the driving beam member, wherein the piezoelectric member and the driving beam members constitute a piezoelectric unimorph or bimorph structure.

In this deflecting mirror, when a voltage is applied to the piezoelectric material layer, the driving beam members are driven at the same time in the same direction, thereby vibrating the support member in a direction perpendicular to the reflection surface of the mirror, resulting in swinging of the mirror.

Alternatively, the deflecting mirror may have configuration such that the piezoelectric member extends on either side from the one third point of each of the driving beam members, which is apart from the second end thereof by a distance substantially equal to one third of the length of the driving beam member. By applying a voltage to the piezoelectric member, the pair of driving beam members is driven in opposite directions, thereby applying a moment to the support member, resulting in swinging of the mirror.

Alternatively, the deflecting mirror may have configuration such that the piezoelectric member includes a first piezoelectric member extending from the first end of each driving beam member while having about one third or two thirds of the length of driving beam member, and a second piezoelectric member extending from the second end of each driving beam member while having about two thirds or one third of the length of driving beam member. By applying a voltage to the piezoelectric member, the pair of driving beam members is driven in opposite directions, thereby applying a moment to the support member, resulting in swinging of the mirror.

BRIEF DESCRIPTION OF THE DRAWINGS

Various other objects, features and attendant advantages of the present invention will be more fully appreciated as the same becomes better understood from the detailed description when considered in connection with the accompanying drawings in which like reference characters designate like corresponding parts throughout and wherein.

DETAILED DESCRIPTION OF THE INVENTION

The deflecting mirror of the present invention will be explained by reference to drawings.

The method for deflecting a mirror supported by a torsion bar spring using a micro vibration source utilizing piezoelectric driving is classified into a method in which a torsion bar spring is set so as not to pass through the weight center of a mirror, and the ends of the torsion bar spring are driven in the translational direction (i.e., normal direction of the mirror) to generate a torque utilizing the inertia force of the mirror; and a method in which driving beam members connected with a torsion bar spring are driven in the opposite directions at both ends of the rotation axis of the torsion bar spring to impart a torque to the mirror.

The former method will be explained by reference to Examples 1-4 below, and the latter method will be explained by reference to Examples 5-9 below. In addition, in Examples 10-15, configurations of deflecting mirrors, which are driven by improved driving methods, will be explained.

The present invention will be explained by reference to certain specific examples which are provided herein for the purpose of illustration only and are not intended to be limiting.

EXAMPLES

Example 1

In Example 1, a deflecting mirror which is driven by a uniaxial in-phase driving method and in which a piezoelectric member is arranged so as to extend from the first end of each of driving beam members connected with the fixed base while having a length substantially the same as half the length of the driving beam member will be explained.

A first example of the deflecting mirror of the present invention, which deflects light in one direction, will be explained by reference to FIGS. 1-6.

Figure 1:
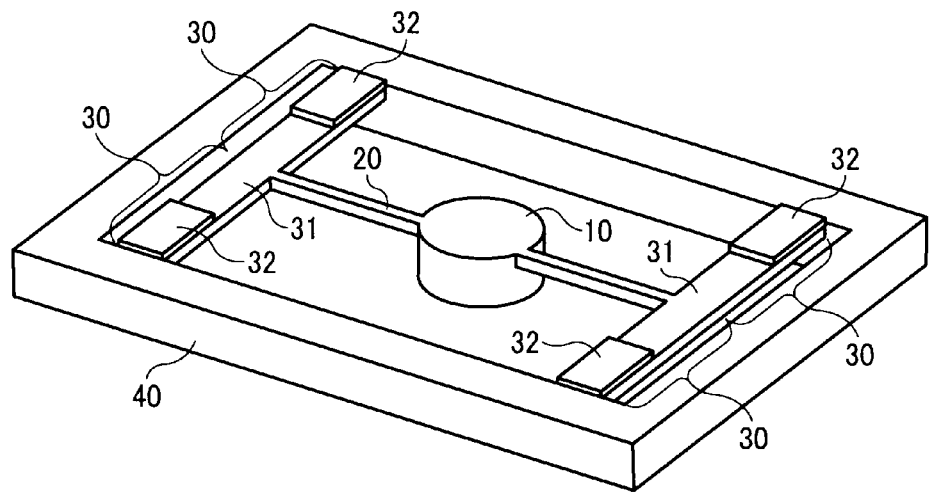
FIG. 1 is a perspective view illustrating an example of the deflecting mirror of the present invention.
Figure 2A:
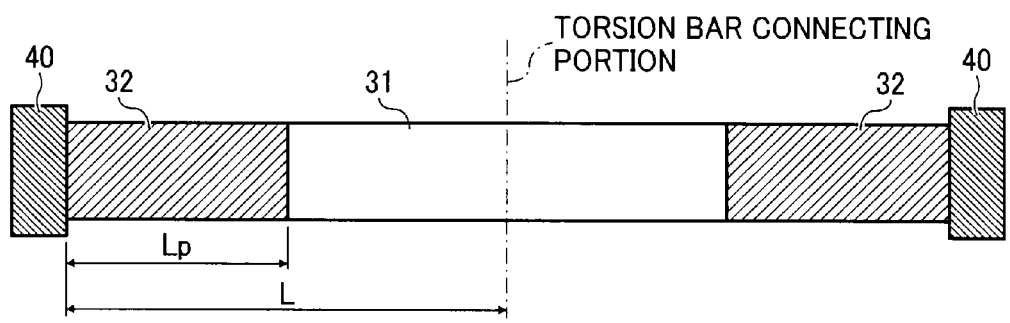
FIG. 2A illustrates a pair of driving beam members of the deflecting mirror illustrated in FIG. 1.
Figure 2B:
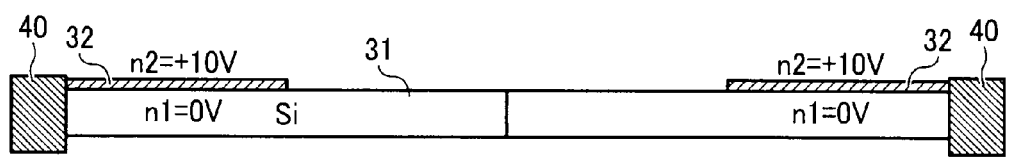
FIG. 2B is a side view of the driving beam members illustrated in FIG. 2A for explaining an example of applying voltage thereto.

FIG. 1 is a perspective view illustrating the entire of the first example of the deflecting mirror. FIG. 2A is a schematic plan view illustrating driving beam members for driving the deflecting mirror, and FIG. 2B is a schematic side view for explaining an example of applying voltage to the driving beam members.

Referring to FIG. 1, the deflecting mirror includes a mirror 10 having a reflection surface from which light is reflected; and a torsion bar spring 20 serving as a support member, which is an elastic support member and which is connected with the mirror 10 in such a manner that the axis of the torsion bar spring passes through the mirror 10 while being apart from the center of gravity of the mirror by ΔS.

Each of the two ends of the torsion bar spring 20 opposite to the ends thereof connected with the mirror 10 is connected with ends (second ends) of a pair of driving beam members 30. The other end (first end) of each of the driving beam members is connected with a fixed base 40. The driving beam members 30 are set so as to be substantially perpendicular to the torsion bar spring 20. As illustrated in FIG. 1, a pair of driving beam members is arranged at each of the two ends of the torsion bar spring 20 opposite to the ends thereof connected with the mirror.

In this example of the deflecting mirror, the mirror 10, torsion bar spring 20 and driving beam members 30 are integrally formed using a MEMS (micro electro mechanical systems) process. The mirror 10 has a configuration such that a thin film of a metal such as aluminum is formed on a surface of a silicon board, resulting in formation of a reflection surface. The driving beam members have a flat plate form and a unimorph structure such that a piezoelectric material layer 32 serving as a piezoelectric member is formed on a portion of one surface of a support beam member 31.

As the portion having a unimorph structure becomes thinner, the support beam member 31 can be deformed more easily. However, when the mirror 10 is too thin, the reflection surface is easily deformed, thereby deteriorating the optical properties of the wave front of the mirror. Therefore, the deflecting mirror of the present invention is prepared by a method in which a silicon on insulator (SOI) wafer is used, the support beam member is constituted of only the active layer so as to be thin, and the mirror has the same thickness as the combination of the active layer and support substrate of the SOI wafer. In this example, the active layer has a thickness of 0.05 mm and the support substrate has a thickness of 0.3 mm. In addition, the torsion bar spring 20 has the same thickness as the active layer of the SOI wafer, but is not limited thereto. The thickness of the torsion bar spring 20 may be the same as the thickness of the support substrate or the thickness of the combination of the active layer and the support substrate. The thickness is determined depending on the required resonance frequency and the layout designability.

Figure 3A:
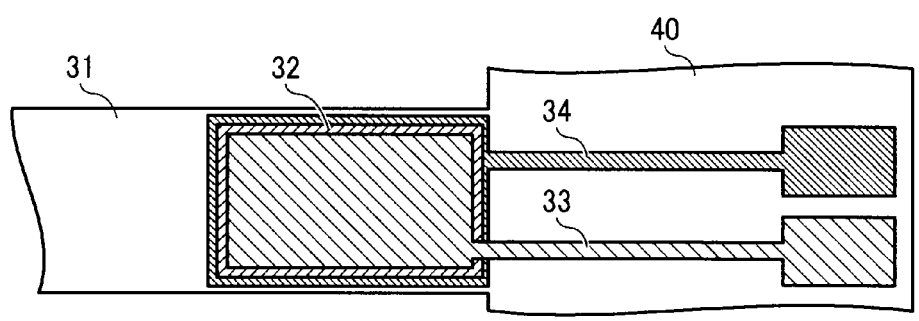
FIGS. 3A-3C illustrate the structure of the driving beam members of the deflecting mirror illustrated in FIG. 1.
Figure 3B:
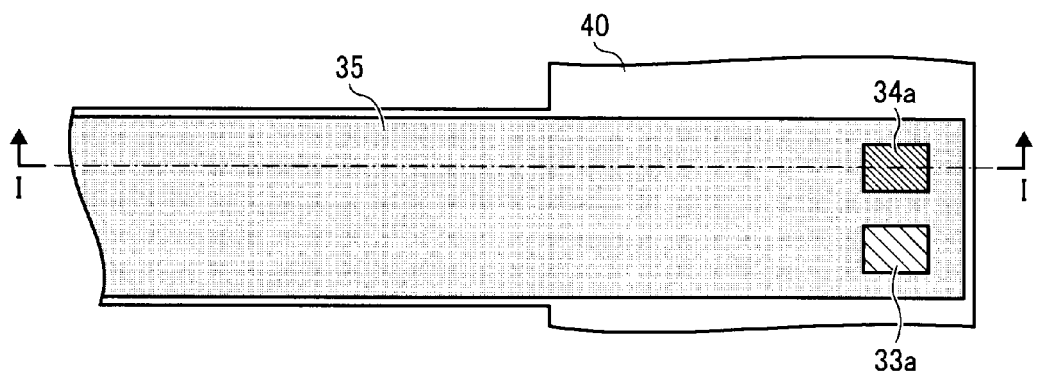
Figure 3C:
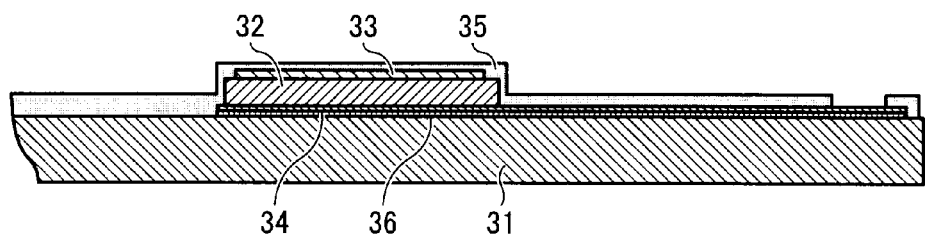

Next, the driving beam member 30 will be explained in detail FIGS. 3A-3C are schematic views for explaining the structure of the pair of driving beam members illustrated in FIG. 2. FIG. 3A is a plan view of an example of the driving beam member 30 having a structure such that a lower electrode 34, a piezoelectric material layer 32, and an upper electrode 33 are overlaid on the support beam member 31. FIG. 3B is a plan view of another example of the driving beam member having a structure such that an insulating layer 35 is further formed on the driving beam member illustrated in FIG. 3A. FIG. 3C is a cross-sectional view of the driving beam member illustrated in FIG. 3B, when the driving beam member is cut at a line I-I.

Referring to FIGS. 3A-3C, an adhesive layer 36, a lower electrode 34, a piezoelectric material layer 32, and an upper electrode 33 are formed on the support beam member 31 by sputtering. These layers are subjected to etching so that necessary portions thereof remain. The adhesive layer 36 is made of titanium (Ti), the upper and lower electrodes are made of platinum (Pt), and the piezoelectric material layer is made of lead titanate zirconate (PZT). By wiring land portions 33a and 34a of the upper and lower electrodes and applying a voltage thereto, the piezoelectric material layer 32 expands and contracts along the surface of the support beam member 31, and thereby the driving beam members are deformed (warped). By applying a same-direction voltage to each of the piezoelectric material layers 32 of the driving beam members 30 as illustrated in FIG. 2 to subject the driving beam members to in-phase driving, the junction of the driving beam members and the torsion bar spring 20 is driven up and down.

The deflecting mirror of this first example has a vibration mode such that the mirror 10 is rotated on a rotation axis parallel to the axis of the torsion bar spring 20. The resonance frequency thereof is determined depending on the rigidity of the torsion bar sprint 20 and the inertia moment of the mirror 10. Strictly speaking, the resonance frequency of the mirror 10 in the rotation mode is influenced by the rigidity of the driving beam member.

By driving the driving beam members 30 by a sinusoidal wave or a pulse wave having a frequency close to the resonance frequency in the rotation mode, the junction of the driving beam members 30 and the torsion bar spring 20 is vibrated up and down. Since the axis of the torsion bar spring 20 is apart from the center of gravity of the mirror 10, the mirror is activated so as to have a rotation mode by the vibration of the junction of the driving beam members 30 and the torsion bar spring 20. Therefore, the mirror 10 has large rotation amplitude even though the driving power is small.

Figure 4:
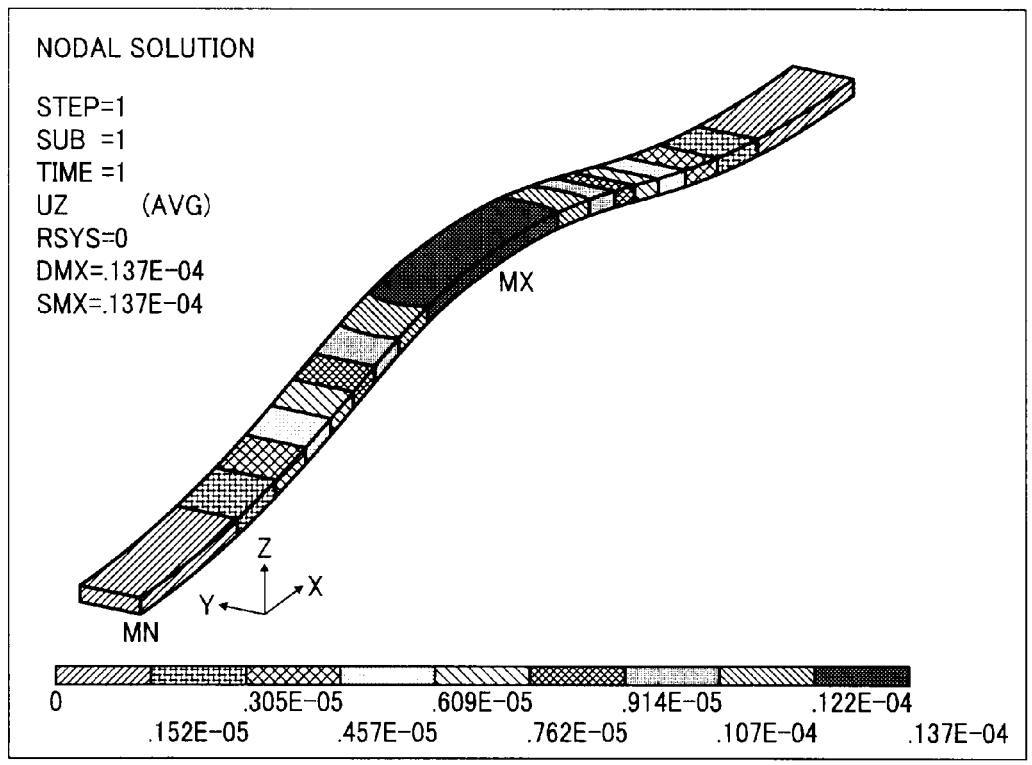
FIG. 4 is a view illustrating a simulation result showing how the driving beam members of the deflecting mirror illustrated in FIG. 1 are bent when driving the deflecting mirror.

In this regard, as illustrated in FIG. 2, the piezoelectric material layer 32 is arranged so as to extend from the first end thereof connected with the fixed base 40 to a midpoint of the driving beam member 30. Namely, the piezoelectric material layer 32 has a length substantially the same as half the length of the driving beam member 30. By using a driving beam member having such configuration, a larger driving force can be generated by a power lower than that in a case where the piezoelectric material layer is formed on the entire surface of the driving beam member 30. In this regard, the pair of driving beam members 30 in the driving mode is deformed as illustrated in FIG. 4. If the piezoelectric material layer 32 is formed on the entire surface of the driving beam members, the driving beam members are warped in the opposite direction, and thereby the deformation thereof is disturbed.

Figure 5:
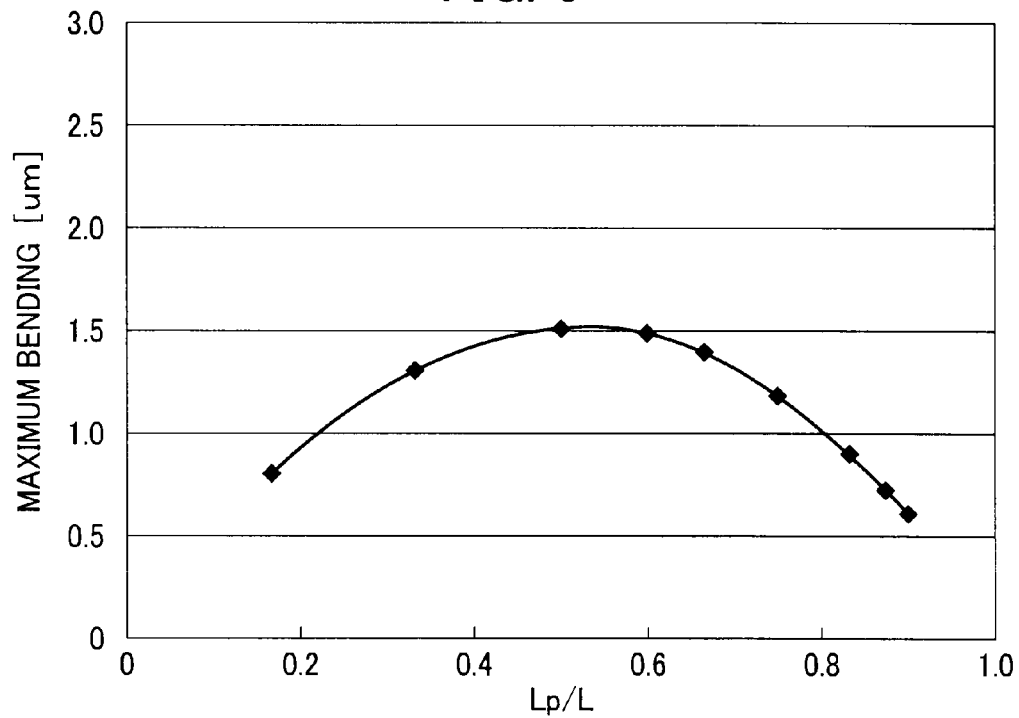
FIG. 5 is a graph showing the simulated relationship between the ratio (Lp/L) of the length (Lp) of the piezoelectric member to the length (L) of the driving beam member and the maximum bending of the pair of driving beam members illustrated in FIG. 2.
Figure 6:
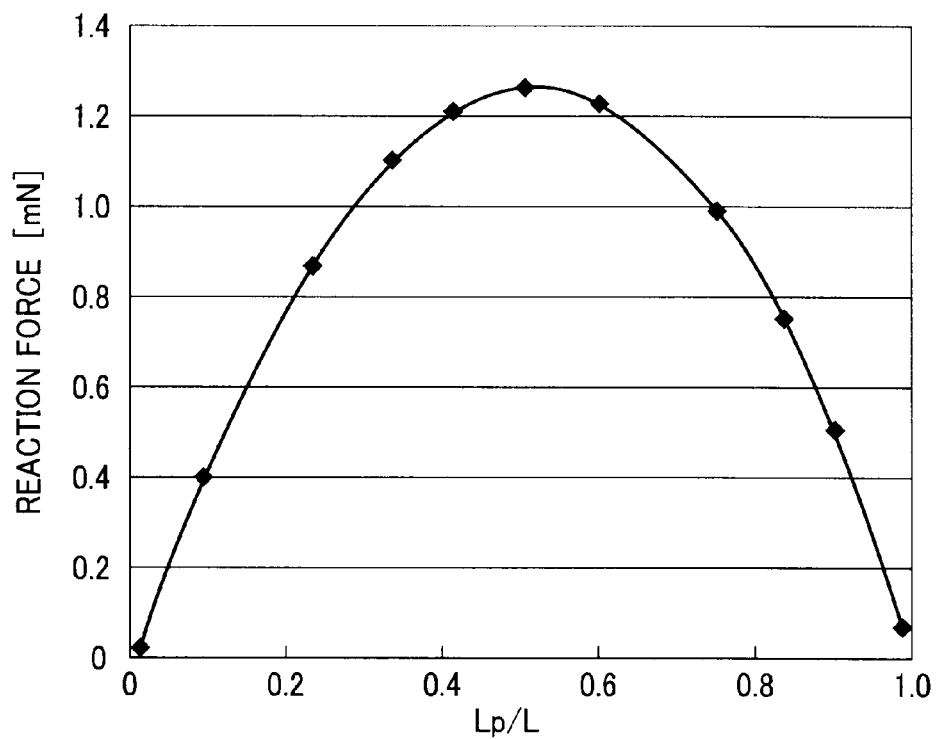
FIG. 6 is a graph showing the simulated relationship between the ratio (Lp/L) and the reactive force of the pair of driving beam members illustrated in FIG. 2 when the driving beam members are prevented from bending.

The results of simulation of bending of a pair of driving beam members which is modeled such that both ends thereof are fixed and the structure thereof is unimorph structure are illustrated in FIG. 5. In this regard, the center portion of the driving beam member is freely deformed. In FIG. 5, the ratio (Lp/L) of the length (Lp) of the piezoelectric material layer (PZT) 32, which extends from the first end of each driving beam member on the fixed base side, to the length (L) of the driving beam member 30 is plotted on the X-axis, and the maximum bending of the pair of driving beam members is plotted on the Y-axis. It is clear from FIG. 5 that the maximum bending is maximized when the ratio (Lp/L) is 0.5. Although this simulation is made assuming that the center portion of the pair of driving beam members is freely deformed, in reality the torsion bar spring 20 with the mirror 10 is connected with the center of the pair of driving beam members 30 as illustrated in FIG. 1, and an inertia force is applied thereto when the pair of driving beam members is driven. FIG. 6 illustrates the reaction force of the pair of driving beam members when deformation of the center portion thereof is prevented. Similarly to the curve of FIG. 5, the curve of FIG. 6 is maximized when the ratio (Lp/L) is 0.5.

In this example, not only the upper and lower electrodes 33 and 34 but also the piezoelectric material layer 32 are formed by sputtering, but the method for forming the piezoelectric material layer is not limited thereto. For example, a method in which a bulk of a piezoelectric material is cut so as to have a proper size, and the cut piezoelectric material is adhered to the support beam member with an adhesive, and a method in which a piezoelectric material layer is formed by an aerosol deposition method (AD method) can also be used.

In addition, in this example the driving beam member has a unimorph structure in that a piezoelectric material layer is arranged on one side of a support beam member, but the driving beam member may have a bimorph structure in that a piezoelectric material layer is arranged on both sides of a support beam member.

Further, the deflecting mirror of this example has four driving beam members, wherein two driving beam members are connected to an end of the torsion bar spring 20 and the other two driving beam members are connected to another end of the torsion bar spring. However the number of driving beam members is not limited thereto, and it is possible that driving beam members are arranged so as to be parallel to each other at an end of the torsion bar spring to enlarge the driving force of the driving beam members.

Example 2

In Example 2, a deflecting mirror which is driven by a uniaxial in-phase driving method and in which a piezoelectric material is arranged so as to extend from the junction (i.e., second end) of the driving beam member and the elastic member (torsion bar spring) while having a length substantially the same as half the length of the driving beam member will be explained.

A second example of the deflecting mirror of the present invention will be explained by reference to FIGS. 7-10.

Figure 7:
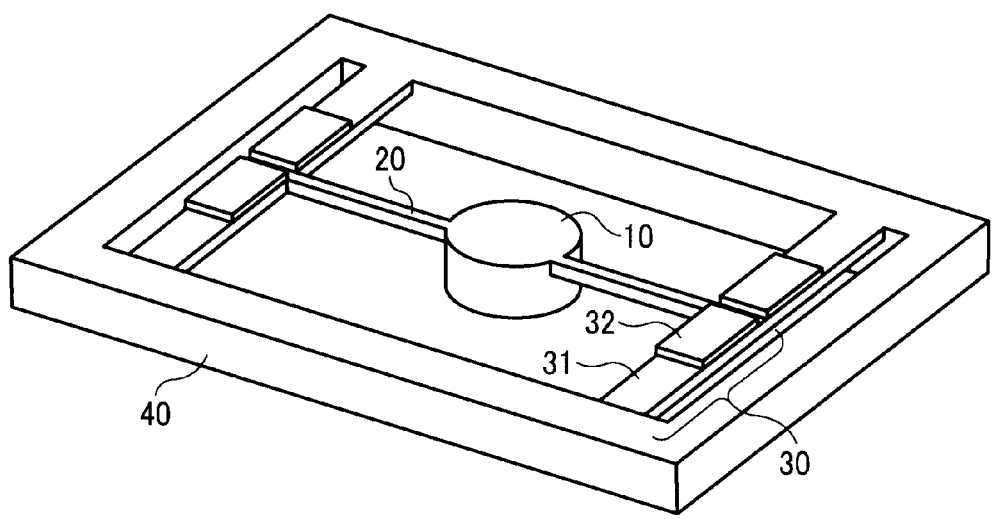
FIG. 7 is a perspective view illustrating another example of the deflecting mirror of the present invention.
Figure 8A:
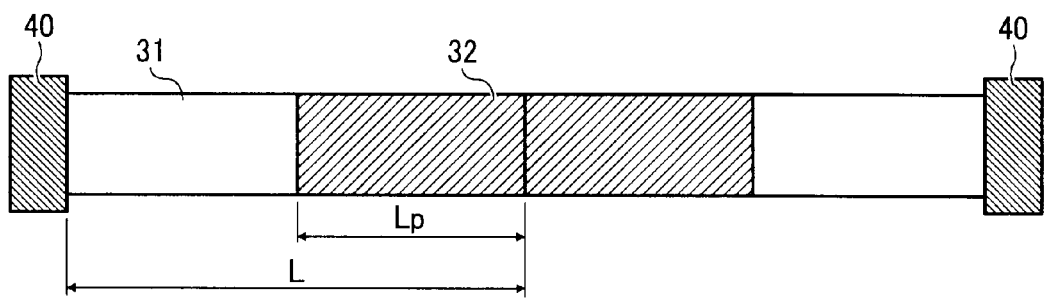
FIG. 8A illustrates a pair of driving beam members of the deflecting mirror illustrated in FIG. 7.
Figure 8B:
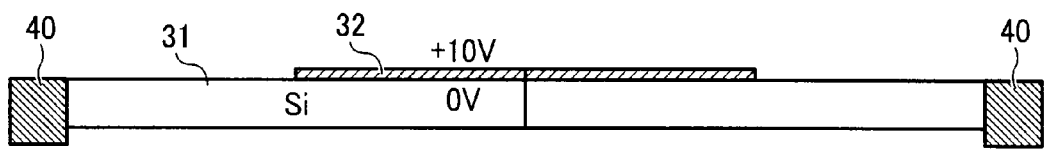
FIG. 8B is a side view of the driving beam members illustrated in FIG. 8A for explaining an example of applying voltage thereto.

FIG. 7 is a perspective view illustrating the entire of the second example of the deflecting mirror. FIG. 8A is a schematic plan view illustrating driving beam members for driving the deflecting mirror, and FIG. 8B is a schematic side view for explaining an example of applying a voltage to the driving beam members.

The second example is a modified version of the first example. As illustrated in FIGS. 7-8, the piezoelectric material layer 32 made of PZT is arranged so as to extend from the junction (second end) of the driving beam member 30 and the elastic member (torsion bar spring) 20 while having a length (Lp) substantially the same as half the length (L) of the driving beam member. By using a driving beam member having such configuration, a larger driving force can be generated by a power lower than that in a case where the piezoelectric material layer is formed on the entire surface of the driving beam members 30. In addition, the piezoelectric material layer 32 can be formed at the center of the support beam member while united in this example, although in the first example the piezoelectric material layer is separated into two parts. Therefore, the number of wires connected with the piezoelectric material layer can be reduced, resulting in simplification of the structure of the driving beam member. In particular, in a case where a bulk piezoelectric material is used for forming the piezoelectric material layer 32, the number of parts can be reduced, resulting in simplification of assembling.

A simulation similar to that mentioned above in Example 1 is also performed on this second example, which is modeled such that both ends of the pair of driving beam members are fixed and the driving beam members have a unimorph structure.

Figure 9:
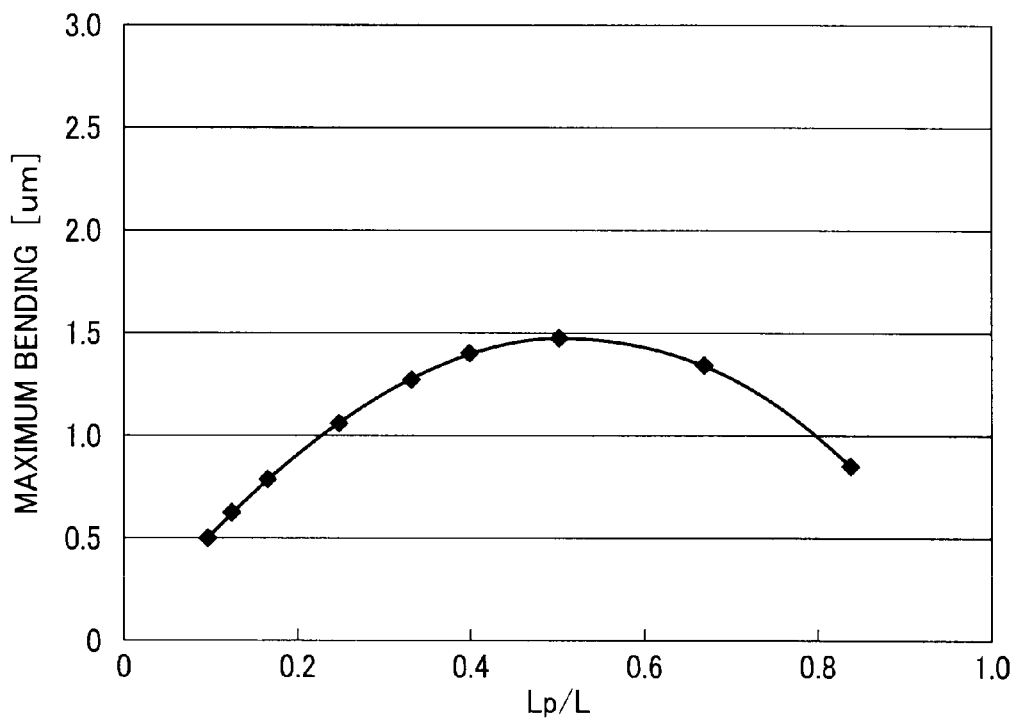
FIG. 9 is a graph showing the simulated relationship between the ratio (Lp/L) and the maximum bending of the pair of driving beam members illustrated in FIG. 8.
Figure 10:
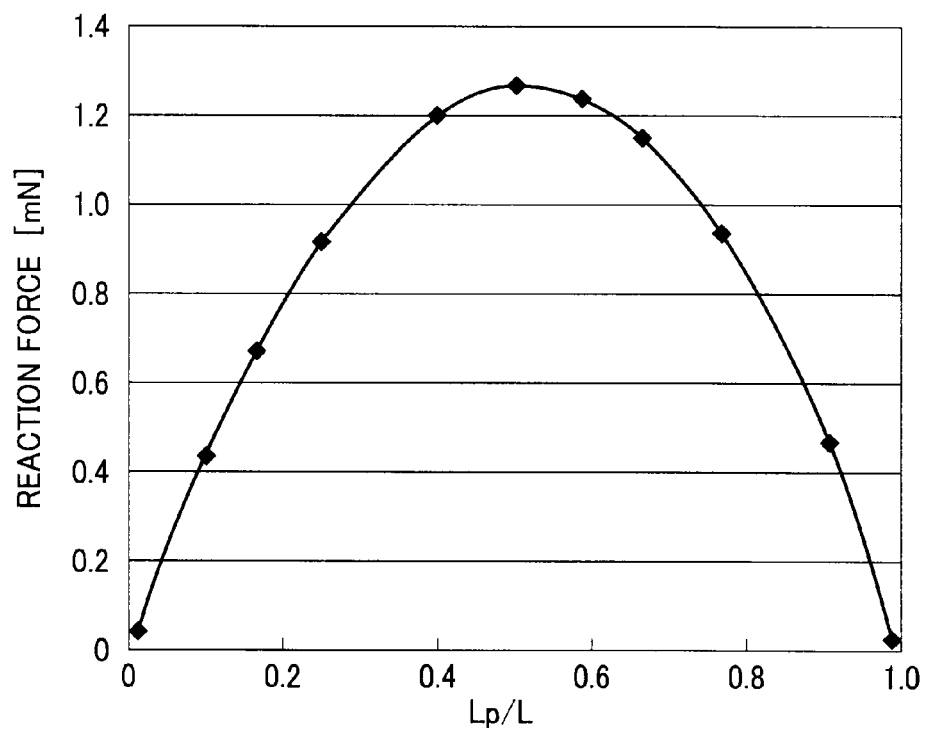
FIG. 10 is a graph showing the simulated relationship between the ratio (Lp/L) and the reactive force of the pair of driving beam members illustrated in FIG. 8 when the driving beam members are prevented from bending.

In FIG. 9, the ratio (Lp/L) of the length of the piezoelectric material layer (PZT) 32, which extends from the center of the pair of driving beam members, to the length (L) of the driving beam member is plotted on the X-axis, and the maximum bending is plotted on the Y-axis. It is clear from FIG. 5 that the maximum bending of the pair of driving beam members is maximized when the ratio (Lp/L) is 0.5. FIG. 10 illustrates the reaction force of the pair of driving beam members when deformation of the center portion thereof is prevented. Similarly to the curve of FIG. 9, the curve of FIG. 10 is maximized when the ratio is 0.5.

In addition, in this example the driving beam members have a unimorph structure in that the piezoelectric material layer 32 is arranged on one side of the support beam member 31, but the driving beam members may have a bimorph structure in that the piezoelectric material layer is arranged on both sides of the support beam member.

Example 3

In Example 3, a deflecting mirror, which is driven by a uniaxial in-phase driving method and in which first and second piezoelectric material layers having opposite phases are arranged in a driving beam member, will be explained.

A third example of the deflecting mirror of the present invention will be explained by reference to FIGS. 11-15.

Figure 11:
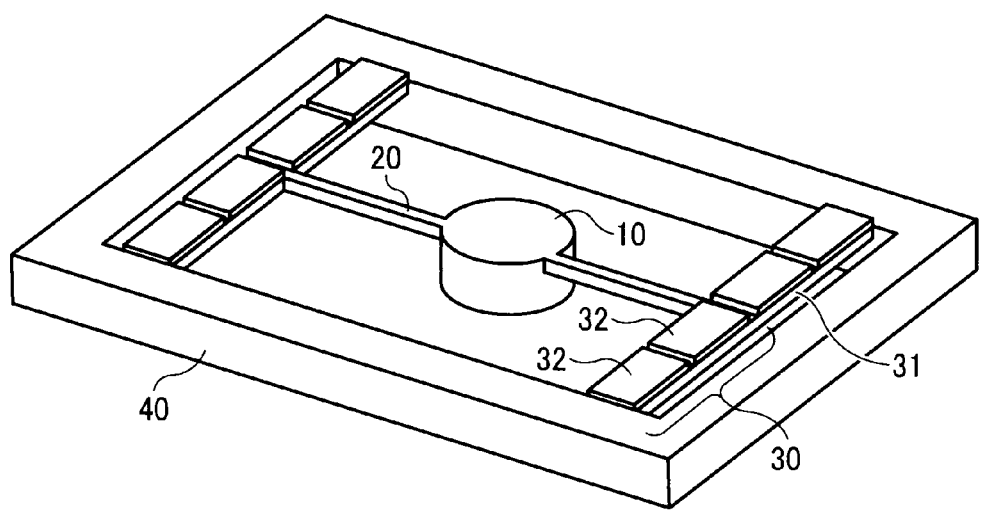
FIG. 11 is a perspective view illustrating another example of the deflecting mirror of the present invention.
Figure 12A:
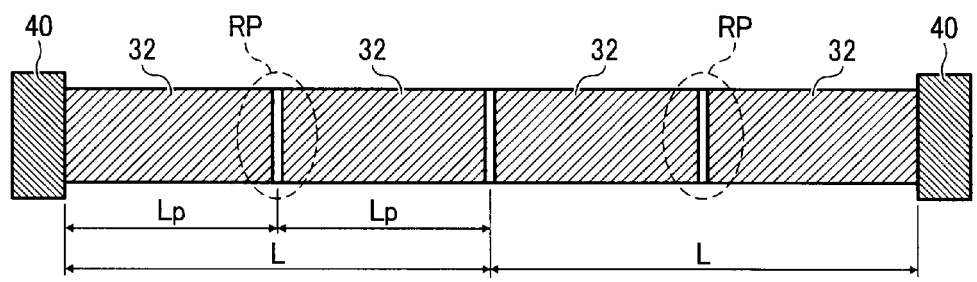
FIG. 12A illustrates a pair of driving beam members of the deflecting mirror illustrated in FIG. 11.
Figure 12B:
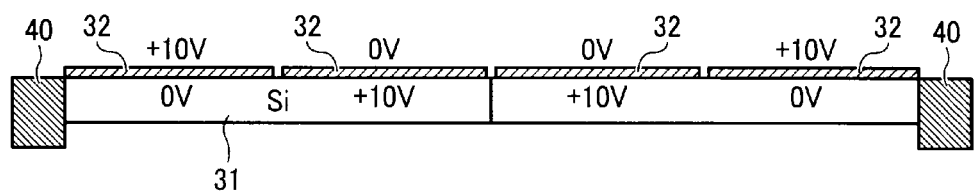
FIG. 12B is a side view of the driving beam members illustrated in FIG. 12A for explaining an example of applying voltage thereto.
Figure 13A:
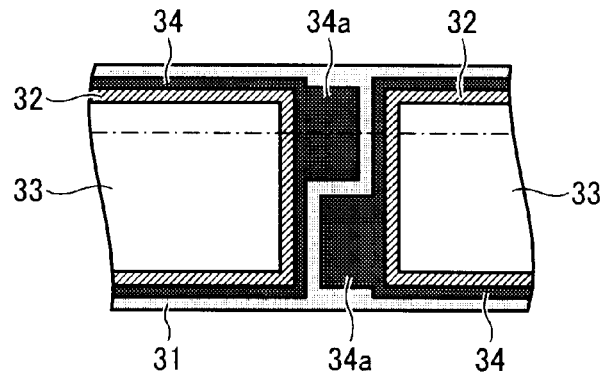
FIGS. 13A-13D illustrate the structure of the reverse phase wiring portion of the driving beam members illustrated in FIG. 12.
Figure 13B:
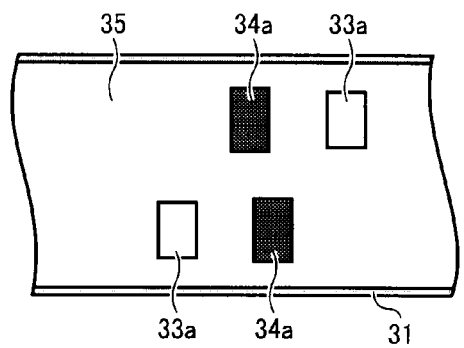
Figure 13C:
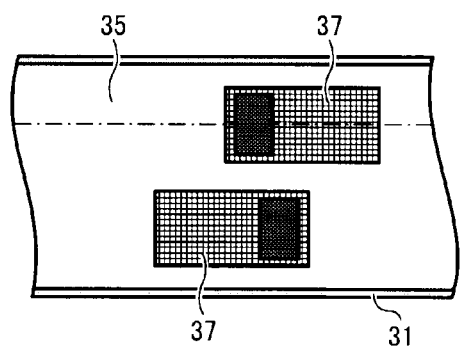
Figure 13D:
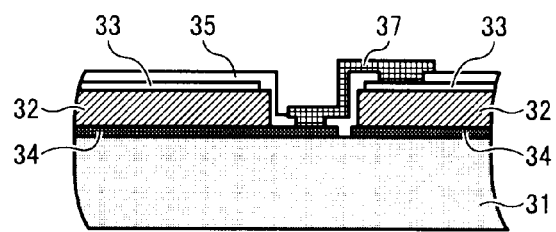

FIG. 11 is a perspective view illustrating the entire of the third example of the deflecting mirror. FIG. 12A is a schematic plan view illustrating a pair of driving beam members for driving the deflecting mirror, and FIG. 12B is a schematic side view for explaining an example of applying a voltage to the driving beam members.

The third example is a modified version of the first and second examples, and has advantages of the first and second examples. As illustrated in FIGS. 11-12, the piezoelectric material layer 32 is arranged on substantially the entire portion of the driving beam member 30. At the center of each of the driving beam members 30 (i.e., a midpoint Rp between the junction (second end) of the driving beam members and the torsion bar spring, and the first end of the driving beam member on the fixed base side), the piezoelectric material layer 32 is separated into first and second piezoelectric material layers. At the midpoint Rp (hereinafter sometimes referred to as a reverse wiring portion), opposite driving voltages are applied to the first and second piezoelectric material layers, respectively, as illustrated in FIG. 12B. Specifically, as illustrated in FIGS. 13A-13D, a wire 37 is arranged from the land portion 33a of the upper electrode 33 to the land portion 34a of the lower electrode 34, and another wire is arranged from the land portion 34a to the land portion 33a. By using such driving beam members, a driving force which is a combination of the driving forces in the first and second examples can be generated. Namely, a larger driving force can be generated.

A simulation similar to that mentioned above in Examples 1 and 2 is also performed on this third example, which is modeled such that both ends of the driving beam member are fixed and the driving beam member has a unimorph structure. The results of the simulation are illustrated in FIG. 14.

Figure 14:
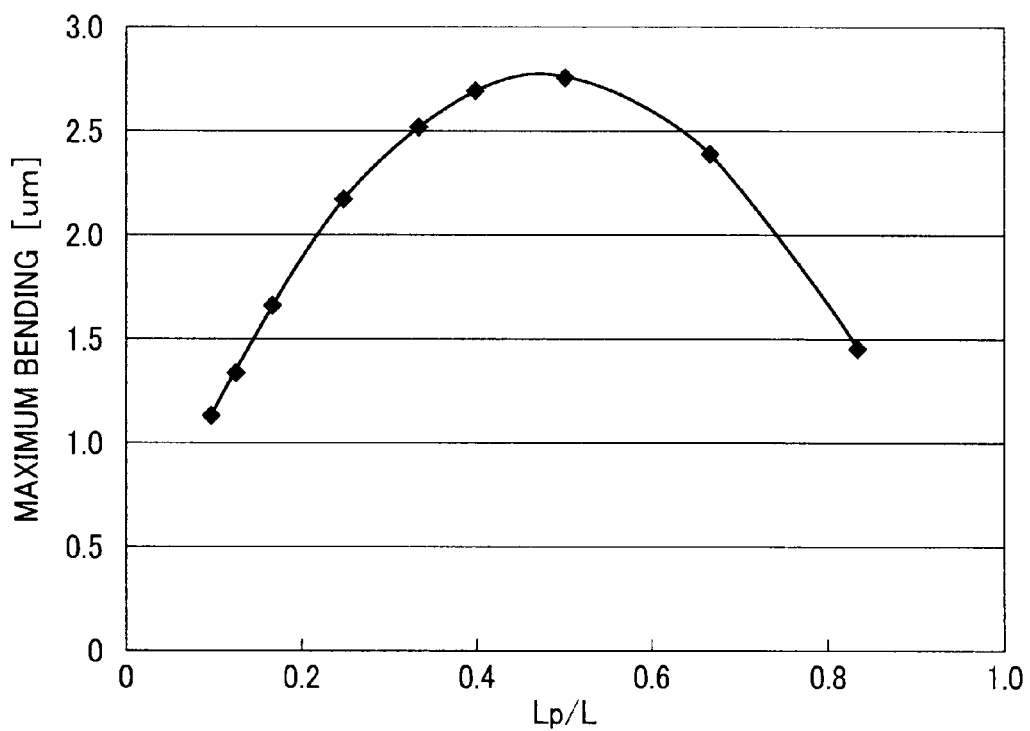
FIG. 14 is a graph showing the simulated relationship between the ratio (Lp/L) and the maximum bending of the pair of driving beam members illustrated in FIG. 12.

FIG. 14 illustrates a case where no load is applied to the center of the pair of driving beam members so that the pair of driving beam members is freely deformed.

Figure 15:
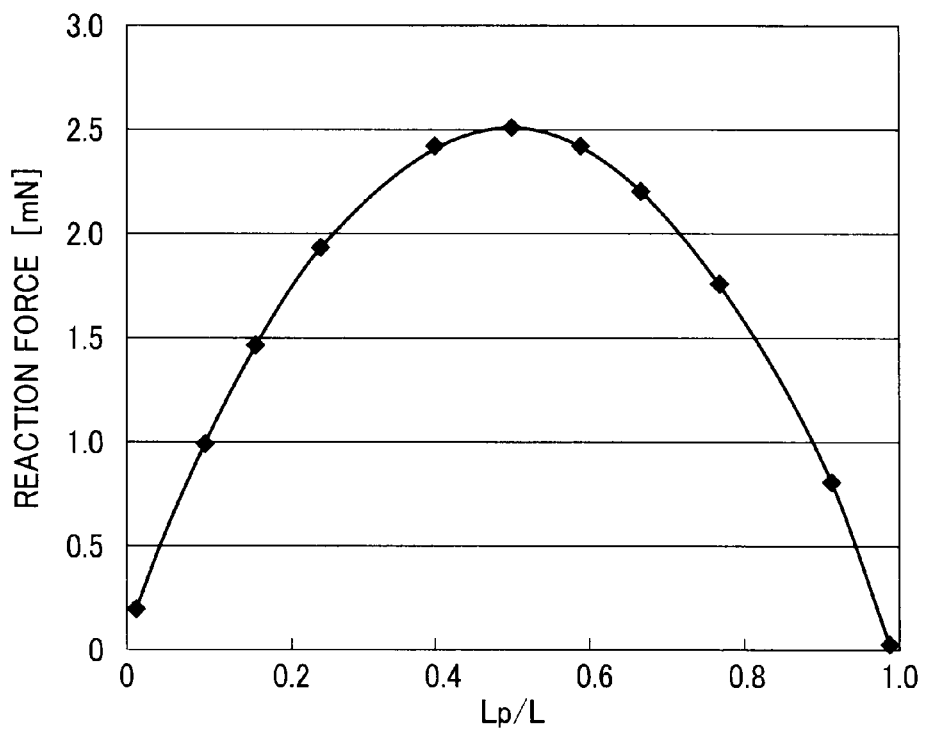
FIG. 15 is a graph showing the simulated relationship between the ratio (Lp/L) and the reactive force of the pair of driving beam members illustrated in FIG. 12 when the driving beam members are prevented from bending.

In FIG. 14, the ratio (Lp/L) of the length of the piezoelectric material layer (PZT) 32, which extends from the second end of each driving beam member, to the length (L) of the driving beam member is plotted on the X-axis, and the maximum bending of the pair of driving beam members is plotted on the Y-axis. It is clear from FIG. 14 that the maximum bending is maximized when the ratio (Lp/L) is 0.5. The curve of FIG. 14 is for the case where the center portion of the pair of driving beam members is freely deformed. FIG. 15 illustrates the reaction force of the pair of driving beam members when deformation of the center portion thereof is prevented. Similarly to the curve of FIG. 14, the curve of FIG. 15 is maximized when the ratio (Lp/L) is 0.5. It is clear from comparison of the curves of FIGS. 14 and 15 with the curves of FIGS. 5, 6, 9 and 10 that the maximum values of the maximum bending and the reaction force in FIGS. 14 and 15 are about twice the maximum values in FIGS. 5 and 6 (or 9 and 10).

In addition, in this example the driving beam member has a unimorph structure in that a piezoelectric material layer is arranged on one side of a support beam member, but the driving beam member may have a bimorph structure in that a piezoelectric material layer is arranged on both sides of a support beam member.

Example 4

In Example 4, a deflecting mirror, which is driven by a uniaxial in-phase driving method and in which first and second piezoelectric material layers used for driving and detecting respectively are arranged, will be explained.

When a reflecting mirror is used under actual environmental conditions, a problem in that the resonance frequency or amplitude of the reflecting mirror varies depending on the variables such as rigidity of the torsion bar spring, weight of the mirror, manufacturing errors of parts, and environmental temperature is caused. In order to prevent occurrence of the problem, it is preferable to detect the movement of the mirror to control the movement.

In this fourth example, the movement of the deflecting mirror is detected.

Figure 16:
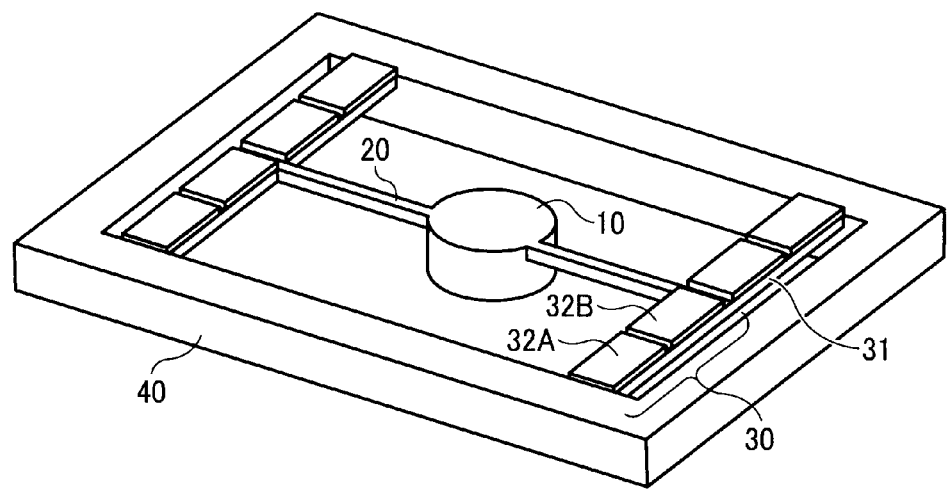
FIG. 16 is a perspective view illustrating another example of the deflecting mirror of the present invention.
Figure 17A:
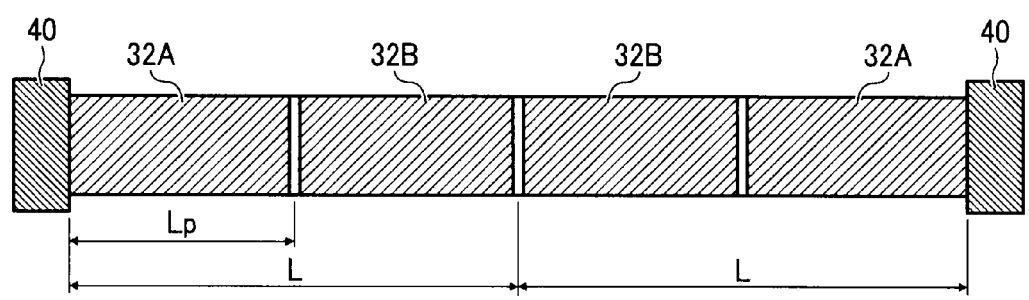
FIG. 17A illustrates a pair of driving beam members of the deflecting mirror illustrated in FIG. 16.
Figure 17B:
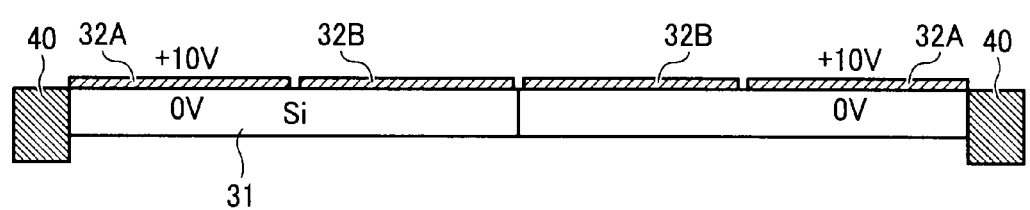
FIG. 17B is a side view of the driving beam members illustrated in FIG. 17A for explaining an example of applying voltage thereto.

FIG. 16 is a perspective view illustrating the entire of the fourth example of the deflecting mirror. FIG. 17A is a schematic plan view illustrating a pair of driving beam members for driving the deflecting mirror, and FIG. 17B is a schematic side view for explaining an example of applying a voltage to the driving beam members.

This fourth example has a structure similar to that of the third example. As illustrated in FIG. 16, the piezoelectric material layer 32 is arranged on substantially the entire portion of the driving beam member 30. At the center of the driving beam member 30 (i.e., a midpoint between the junction (second end) of the driving beam member and the torsion bar spring, and the first end of the driving beam members on the fixed base side), the piezoelectric material layer 32 is separated into first and second piezoelectric material layers 32A and 32B. In this regard, a wire is arranged from the second piezoelectric material layer 32B to the fixed base 40 while passing along the first piezoelectric material layer 32A without contacting the first piezoelectric material layer. A driving voltage is applied to the first piezoelectric material layer 32A to vibrate the mirror 10. Piezoelectric materials have properties such that when a voltage is applied thereto, the piezoelectric materials are deformed, and by deforming the piezoelectric materials, a voltage is generated. Therefore, when the driving beam member 30 is deformed by applying a voltage to the first piezoelectric material layer 32A, a voltage is generated between the upper electrode 33 and the lower electrode 34 of the second piezoelectric material layer 32B. By detecting the thus generated voltage, the degree of deformation of the driving beam member 30 can be determined.

In this fourth example, deformation of the same driving beam member can be detected. Therefore, a signal corresponding to the real deformation of the driving beam member can be obtained. This detection signal corresponds to the movement of the mirror (i.e., scanned light), and therefore the signal can be used as a synchronization signal in image forming apparatus and image projecting apparatus. In order to determine the timing of scanning light, methods in which a light sensitive element is arranged at a point on the light scanning path are typically used. By using this deflecting mirror, it is not necessary to set such a light sensitive element, and thereby the apparatus can be miniaturized and the manufacturing costs of the apparatus can be reduced. In addition, when a light sensitive element is arranged at a point on the light scanning path, a problem in that the scanning range is narrowed is caused. However, by using this deflecting mirror, movement of scanning light can be detected without narrowing the light scanning range.

Figure 18A:
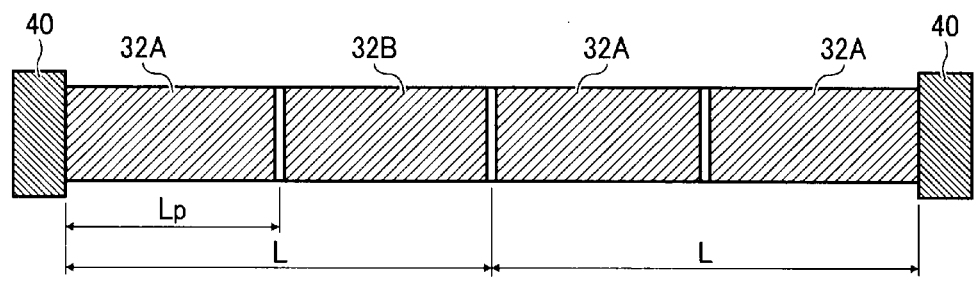
FIG. 18A illustrates another pair of driving beam members of the deflecting mirror illustrated in FIG. 16.
Figure 18B:
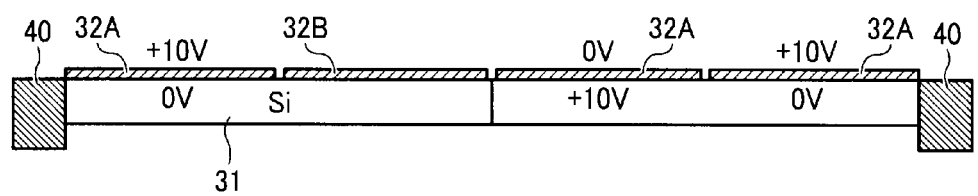
FIG. 18B is a side view of the driving beam members illustrated in FIG. 18A for explaining an example of applying voltage thereto.

Further, when it is desired to obtain a large amplitude, a method in which only one of the second piezoelectric material layers 32B is used for detecting deformation of the driving beam member as illustrated in FIG. 18 can be used. Since the detected signal increases as the degree of deformation increases, a strong signal can be detected in the deflecting mirror having such configuration.

Example 5

In Example 5, a deflecting mirror, which is driven by a uniaxial reverse-phase driving method and in which a piezoelectric material is arranged so as to extend from the first end of each of driving beam members on the fixed base side while having a length (Lp) substantially the same as one third of the length (L) of the driving beam member, will be explained.

The fifth example will be explained by reference to FIGS. 19-23.

Figure 19:
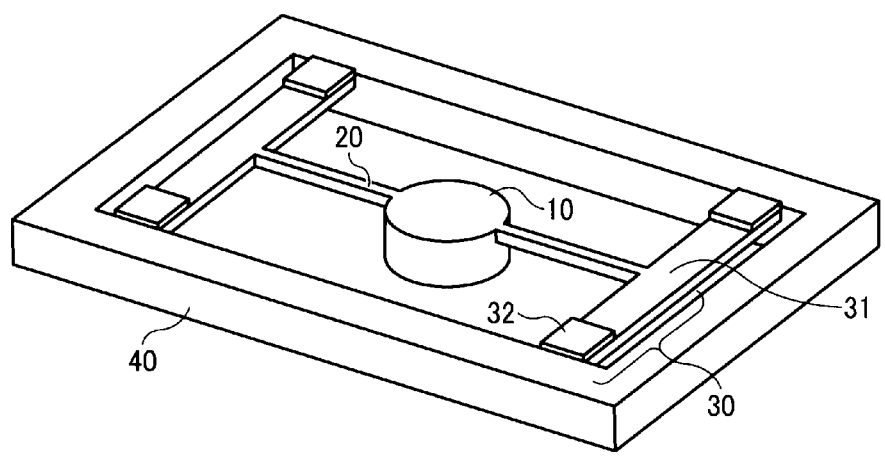
FIG. 19 is a perspective view illustrating another example of the deflecting mirror of the present invention.
Figure 20A:
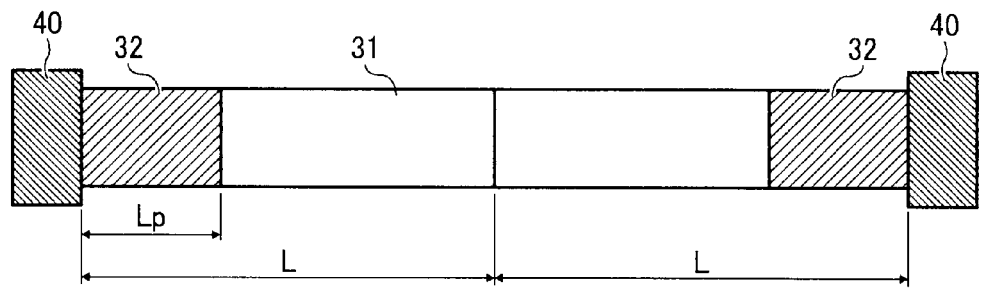
FIG. 20A illustrates a pair of driving beam members of the deflecting mirror illustrated in FIG. 19.
Figure 20B:
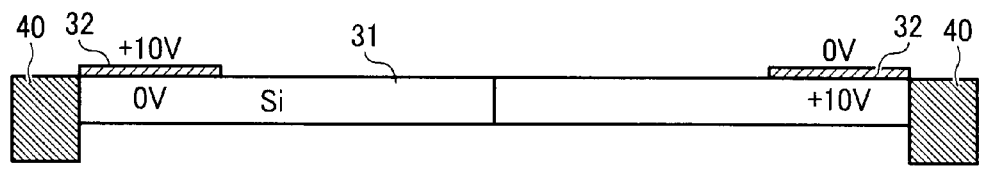
FIG. 20B is a side view of the driving beam members illustrated in FIG. 20A for explaining an example of applying voltage thereto.

FIG. 19 is a perspective view illustrating the entire of the fifth example of the deflecting mirror. FIG. 20A is a schematic plan view illustrating a pair of driving beam members for driving the deflecting mirror, and FIG. 20B is a schematic side view for explaining an example of applying a voltage to the driving beam members.

In this fifth example, the rotation axis of the torsion bar spring serving as an elastic member is driven from both sides thereof in the opposite directions by the driving beam members, resulting in impartment of a torque, thereby driving the reflecting mirror.

The deflecting mirror illustrated in FIG. 19 includes the mirror 10 having a reflection surface from which light is reflected; and the torsion bar spring 20, which is an elastic support member and which is connected with the mirror 10 in such a manner that the axis of the torsion bar spring passes through the center of gravity of the mirror 10. The end of the torsion bar spring 20 opposite to the end on the mirror side is connected with a second end of the driving beam member 30, the other end (first end) of which is connected with the fixed base 40. As illustrated in FIGS. 20A and 20B, the driving beam members 30 are arranged on both sides of the torsion bar spring while extending in a direction perpendicular to the axis of the torsion bar spring 20.

The driving beam member 30 has a unimorph structure in that a piezoelectric material layer is formed on one side of a support beam member. Similarly to the deflecting mirror of Example 1, the lower electrode 34, piezoelectric material (PZT) layer 32, and upper electrode 33 are formed on the support beam member 31 by sputtering. These layers are subjected to etching so that necessary portions thereof remain. By applying a voltage between the upper electrode and the lower electrode, the piezoelectric material layer 32 expands and contracts along the surface of the driving beam member due to the piezoelectric property, and thereby the driving beam member is warped.

In this regard, as illustrated in FIG. 20A, the piezoelectric material extends from the first end of the driving beam member on the fixed base side to the one third point of the driving beam member. Namely, the ratio Lp/L is 1/3 in FIG. 20A. By using a driving beam member having such configuration, a larger driving force can be generated by a power lower than that in a case where the piezoelectric material layer is formed on the entire surface of the driving beam member 30. Unlike the first to fourth examples, the fifth example has configuration such that, as illustrated in FIG. 20B, driving voltages having the opposite directions are applied to the two piezoelectric material layers 32 to produce a torque such that the two driving beam members 30 are driven in the opposite directions.

Figure 21:
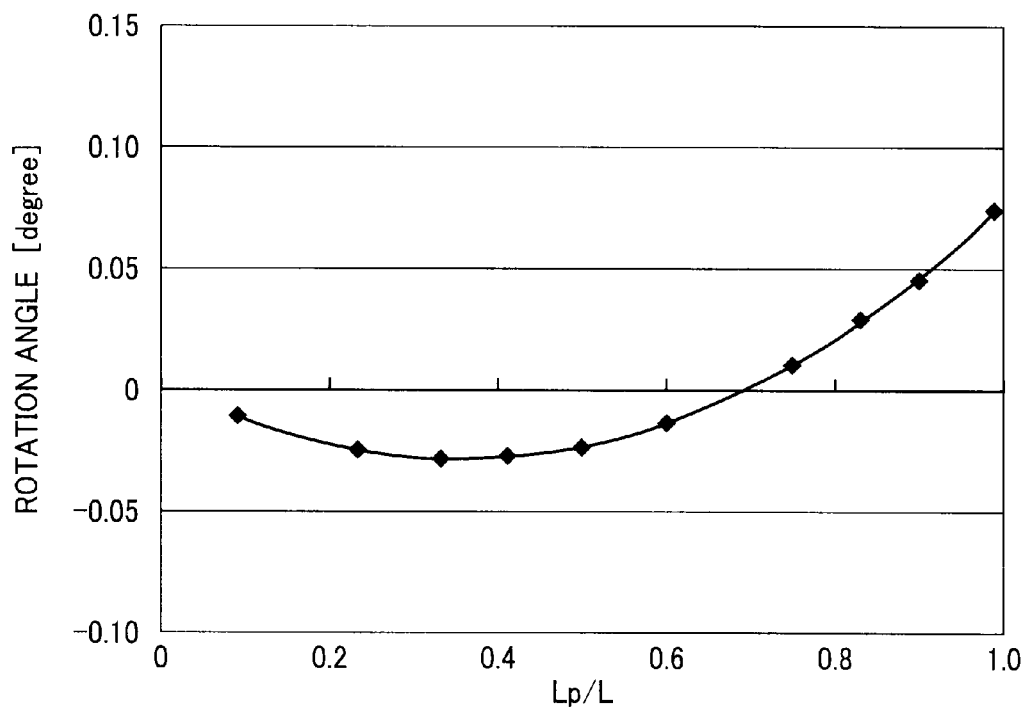
FIG. 21 is a graph illustrating a simulation result showing the rotation angle of the pair of beam members illustrated in FIG. 20 at the junction (i.e., second end) thereof with the torsion bar spring.
Figure 22:
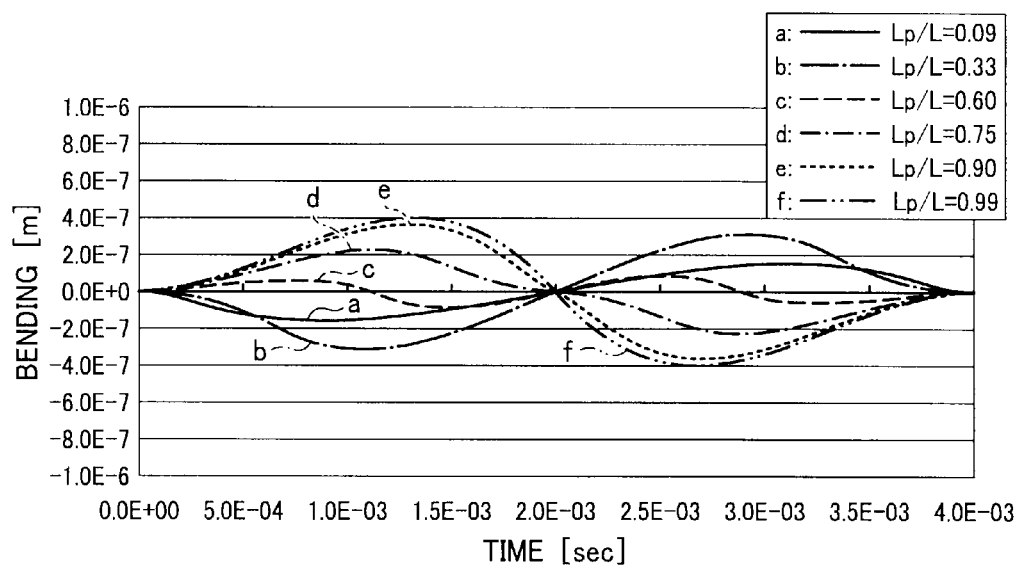
FIG. 22 is a graph illustrating a simulation result showing change of bending of the driving beam members illustrated in FIG. 20 with time.

The results of simulation of bending of the pair of driving beam members of this sample, which are modeled such that both ends thereof are fixed and the structure thereof is unimorph structure, are illustrated in FIGS. 21 and 22. The curve illustrated in FIG. 21 is obtained when the pair of driving members is freely deformed without applying load thereto. In FIG. 21, the ratio (Lp/L) of the length (Lp) of one of the piezoelectric material layers (PZT) 32, which extends from the first end thereof on the fixed base side, to the length (L) of the driving beam member 30 is plotted on the X-axis, and the rotation angle of the pair of driving beam members is plotted on the Y-axis. It is clear from FIG. 21 that the rotation angle is maximized on the minus (−) side when the ratio (Lp/L) is 0.3; the rotation angle is 0 when the ratio is about 0.66; and the rotation angle increases on the plus (+) side as the ratio approaches 1.0. It is clear from FIG. 21 that although the maximum rotation angle can be obtained when the ratio (Lp/L) is 1.0, the ratio (RA/P) of the rotation angle (RA) to the power needed for driving the driving beam member is maximized when the ratio (Lp/L) is 0.3.

Figure 23:
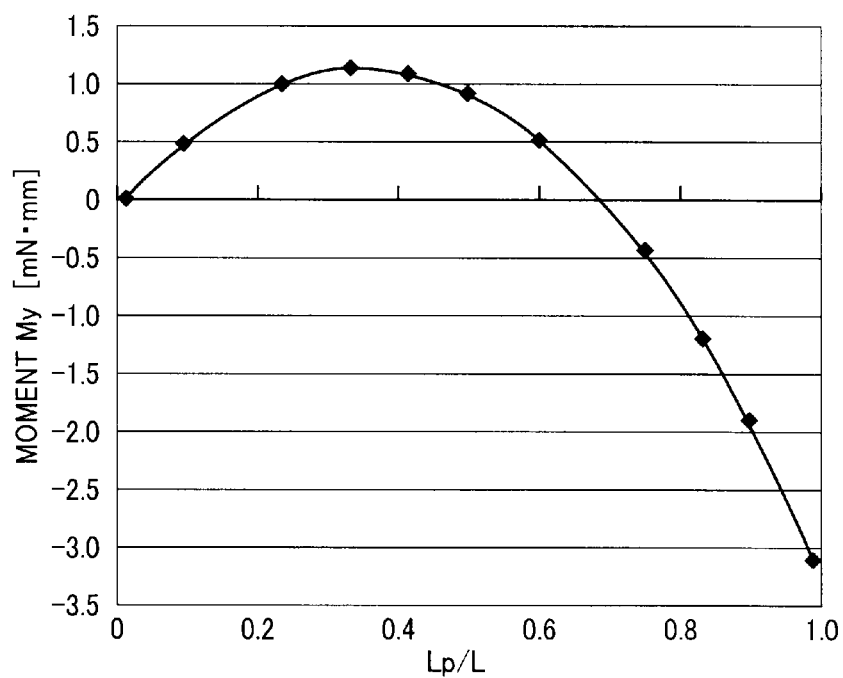
FIG. 23 is a graph showing the simulated relationship between the ratio (Lp/L) and the moment generated when the driving beam members illustrated in FIG. 20 are prevented from bending.

FIG. 22 illustrates change of the degree of bending of the pair of driving beam members with time when the center portion of the pair of driving beam members is freely deformed. However, in reality the torsion bar spring 20 with the mirror 10 is connected with the center of the pair of driving beam members, an inertia force is applied thereto when the driving beam members are driven. FIG. 23 illustrates the reaction force of the pair of driving beam members when deformation of the center portion thereof is prevented. Similarly to the curve of FIG. 21, the curve of FIG. 22 is maximized when the ratio (Lp/L) is 0.3.

In this fifth example, the end of the torsion bar spring 20 is connected with the ends of the pair of driving beam members 30. However, the end of the torsion bar spring may be directly connected with the fixed base 40 while the driving beam member is connected with a point of the torsion bar spring. In this case, the degree of deformation of the mirror decreases because the mirror is restricted more strongly, but the deformation (i.e., cross action) of the mirror in the normal line direction of the reflecting surface thereof can be reduced.

Example 6

In Example 6, a deflecting mirror, which is driven by a uniaxial reverse-phase driving method and in which a piezoelectric material is arranged so as to extend in both directions from the one third point of each of driving beam members from the second end thereof connected with the torsion bar spring, will be explained.

The sixth example will be explained by reference to FIGS. 24 and 25.

Figure 24:
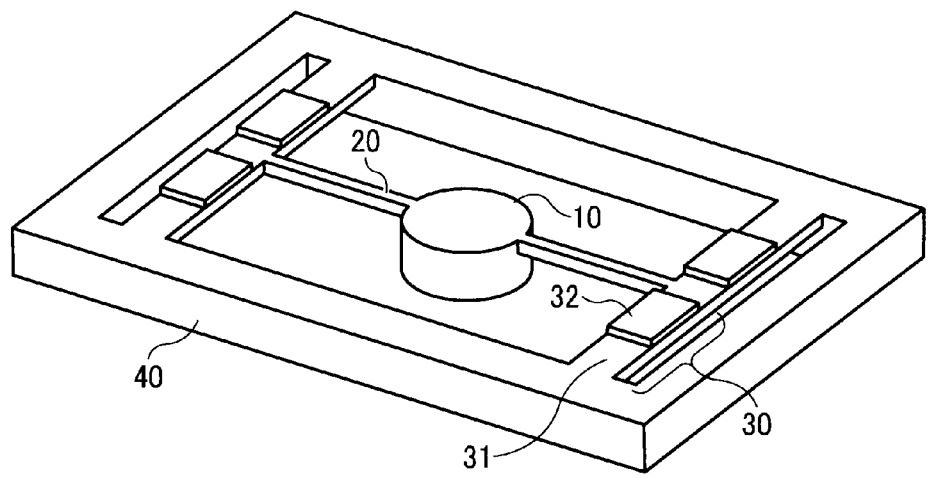
FIG. 24 is a perspective view illustrating another example of the deflecting mirror of the present invention.
Figure 25A:
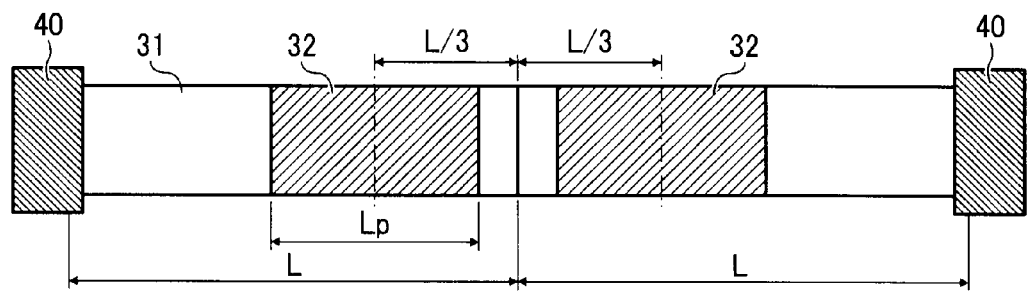
FIG. 25A illustrates a pair of driving beam members of the deflecting mirror illustrated in FIG. 24.
Figure 25B:
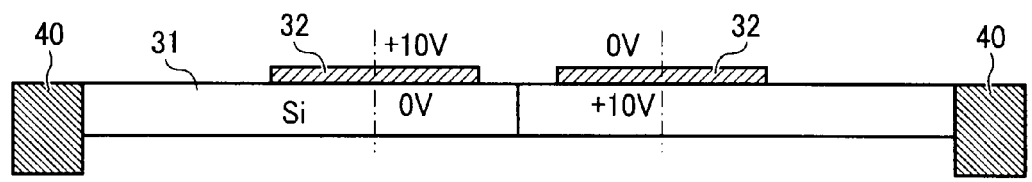
FIG. 25B is a side view of the driving beam members illustrated in FIG. 25A for explaining an example of applying voltage thereto.

FIG. 24 is a perspective view illustrating the entire of the sixth example of the deflecting mirror. FIG. 25A is a schematic plan view illustrating a pair of driving beam members for driving the deflecting mirror, and FIG. 25B is a schematic side view for explaining an example of applying a voltage to the driving beam members.

The sixth example is a modified version of the fifth example. Specifically, as illustrated in FIGS. 24 and 25, the piezoelectric material (PZT) layer 32 is arranged so as to extend in both directions from the one third point of each of the driving beam members, which is measured from the second end thereof connected with the torsion bar spring. By using a pair of driving beam members having such configuration, a larger driving force can be generated by a power lower than that in a case where the piezoelectric material layer is formed on the entire surface of the driving beam members 30. In addition, since the area (length) of the piezoelectric material layer 32 is greater than that in the fifth example (i.e., the length of the layer 32 is greater than L/3), larger force or deformation can be obtained although the driving voltage increases.

Example 7

In Example 7, a deflecting mirror, which is driven by a uniaxial reverse-phase driving method and in which a piezoelectric material is arranged so as to extend from the second end of the driving beam member connected with the torsion bar spring so as to have a length of two thirds of the length of the driving beam member, will be explained.

The seventh example will be explained by reference to FIGS. 26-29.

Figure 26:
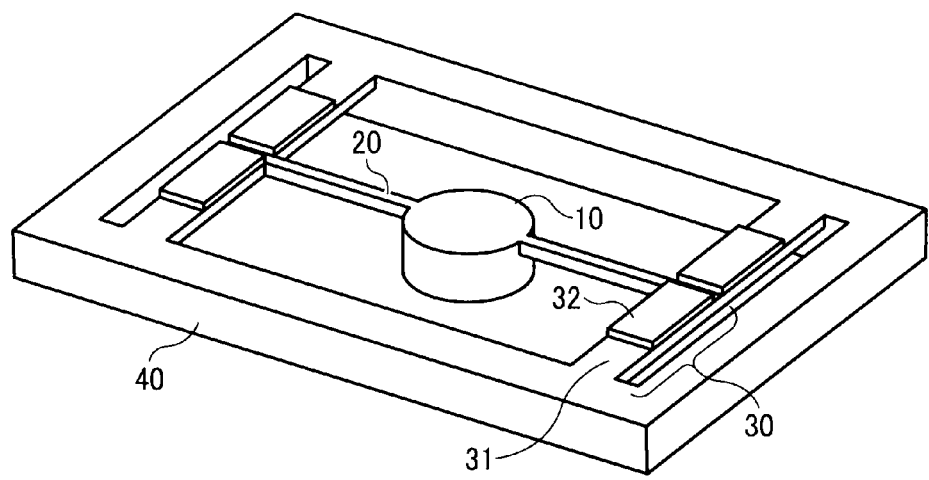
FIG. 26 is a perspective view illustrating another example of the deflecting mirror of the present invention.
Figure 27A:
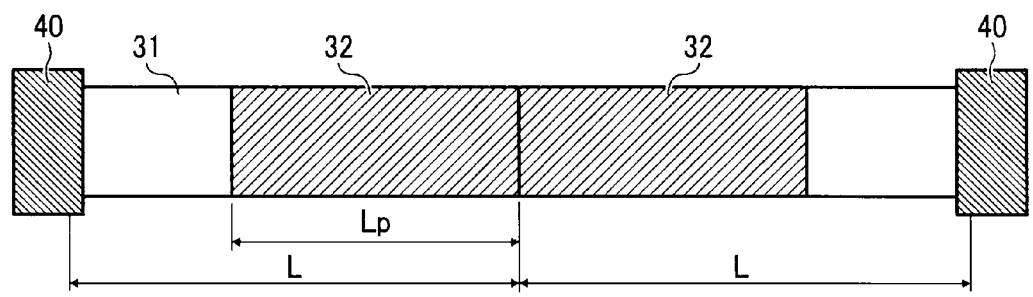
FIG. 27A illustrates a pair of driving beam members of the deflecting mirror illustrated in FIG. 26.
Figure 27B:
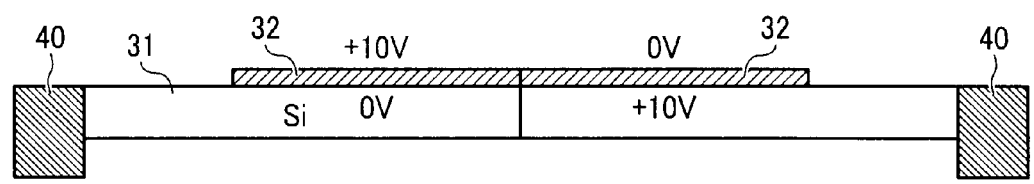
FIG. 27B is a side view of the driving beam members illustrated in FIG. 27A for explaining an example of applying voltage thereto.

FIG. 26 is a perspective view illustrating the entire of the seventh example of the deflecting mirror. FIG. 27A is a schematic plan view illustrating a pair of driving beam members for driving the deflecting mirror, and FIG. 27B is a schematic side view for explaining an example of applying a voltage to the driving beam members.

The seventh example is a modified version of the sixth example and the piezoelectric material layer 32 of the sixth example is further extended in both directions from the one third point such that one end of the piezoelectric material layer 32 reaches the second end of the driving beam member connected to the torsion bar spring. In this case, the largest driving force can be produced. Referring to FIGS. 27A and 27B, it seems that the two piezoelectric material layers 32 are contacted with each other, resulting in occurrence of short-circuit. However, in reality there is a gap, which has the same width as the torsion bar spring has, between the two piezoelectric material layers 32, and thereby the two piezoelectric material layers 32 are not electrically contacted with each other.

Figure 28:
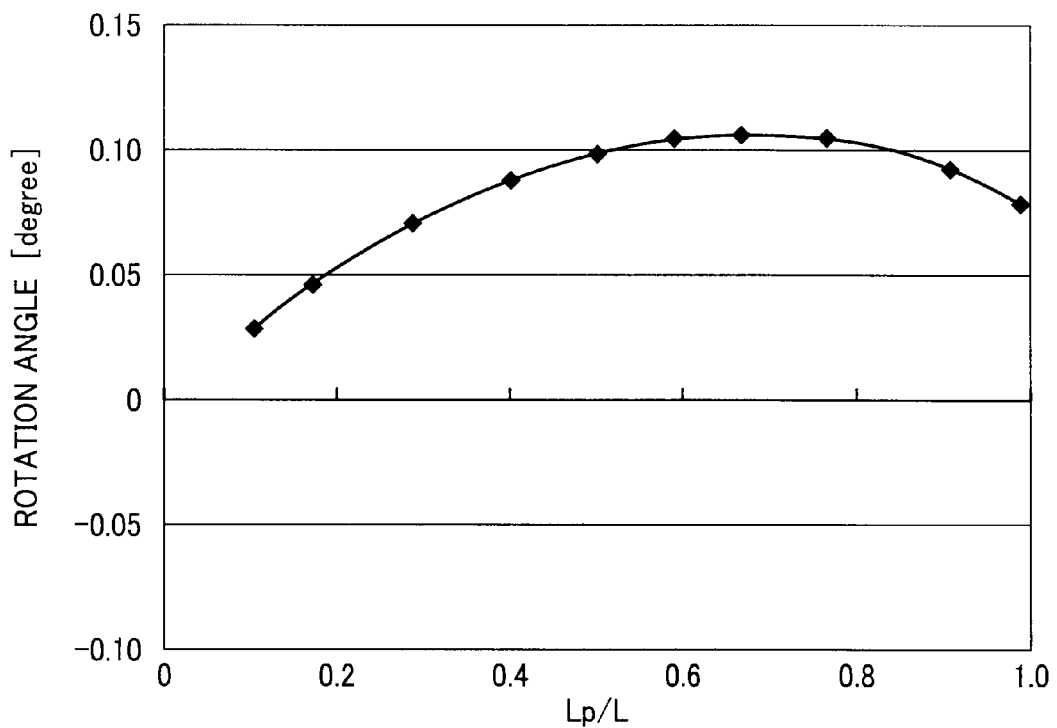
FIG. 28 is a graph illustrating a simulation result showing the rotation angle of the pair of driving beam members illustrated in FIG. 27 at the junction (i.e., second end) thereof with the torsion bar spring.
Figure 29:
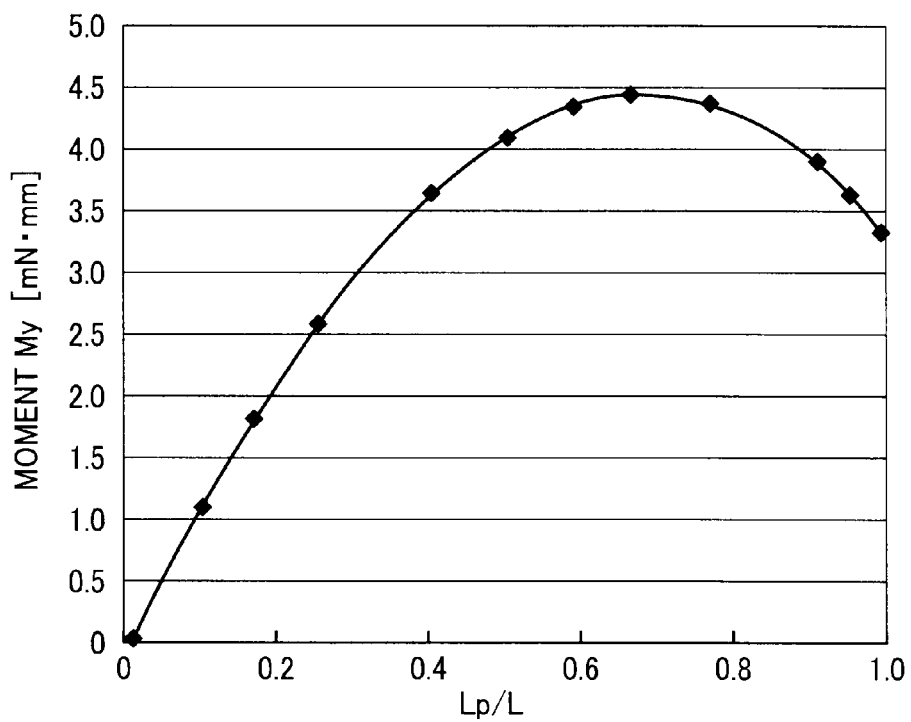
FIG. 29 is a graph showing the simulated relationship between the ratio (Lp/L) and the moment generated when the driving beam members illustrated in FIG. 27 are prevented from bending.

The results of simulation of bending of the pair of driving beam members, which is modeled such that both ends thereof are fixed and the structure thereof is unimorph structure, are illustrated in FIGS. 28 and 29. The curve illustrated in FIG. 28 is obtained when the pair of driving members is freely deformed without applying load thereto. In FIG. 28, the ratio (Lp/L) of the length (Lp) of one of the piezoelectric material layers 32 to the length (L) of the driving beam member 30 is plotted on the X-axis, and the rotation angle of the pair of driving beam members is plotted on the Y-axis. It is clear from FIG. 28 that the rotation angle is maximized when the ratio (Lp/L) is 0.66. FIG. 29 illustrates the reaction force of the pair of driving beam members when deformation of the center portion thereof is prevented. Similarly to the curve of FIG. 28, the curve of FIG. 29 is maximized when the ratio (Lp/L) is 0.66.

Example 8

In Example 8, a deflecting mirror, which is driven by a reverse-phase driving method and in which first and second piezoelectric materials are arranged while separated from each other at the reverse wiring portion Rp and having length of one third and two thirds of the length of the driving beam member, wherein opposite-phase voltages are applied to the first and second piezoelectric materials, will be explained.

The eighth example will be explained by reference to FIGS. 30-34.

Figure 30:
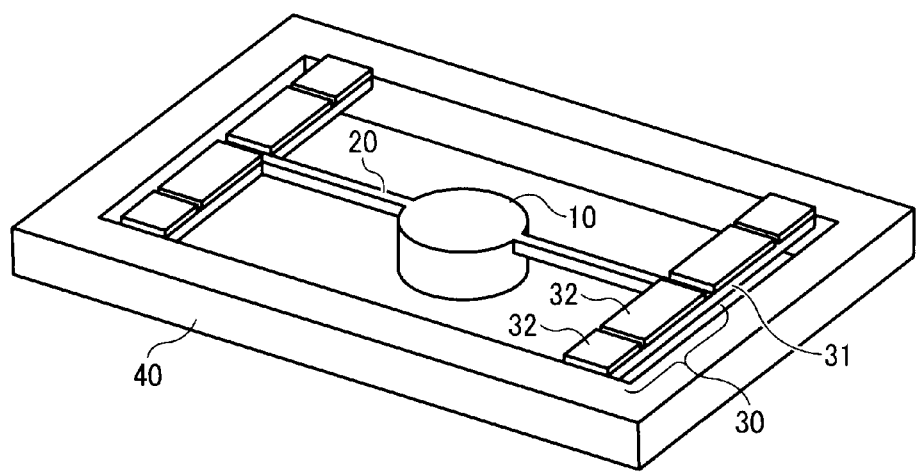
FIG. 30 is a perspective view illustrating another example of the deflecting mirror of the present invention.
Figure 31A:
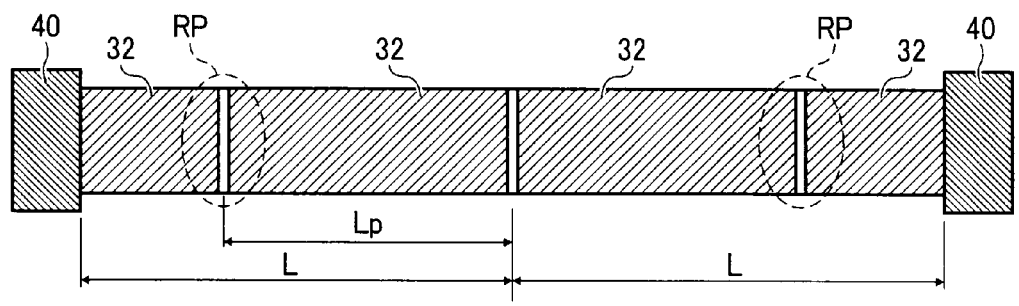
FIG. 31A illustrates a pair of driving beam members of the deflecting mirror illustrated in FIG. 30.
Figure 31B:
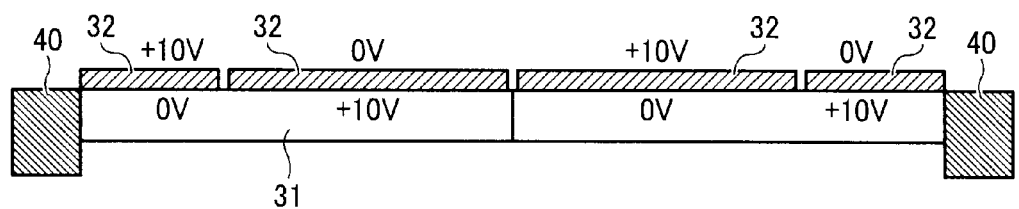
FIG. 31B is a side view of the driving beam members illustrated in FIG. 31A for explaining an example of applying voltage thereto.
Figure 32A:
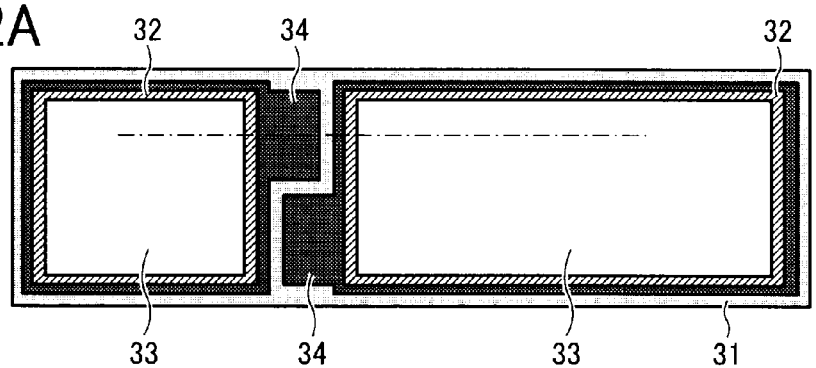
FIGS. 32A-32D illustrate the structure of the reverse phase wiring portion of the driving beam members illustrated in FIG. 31.
Figure 32B:
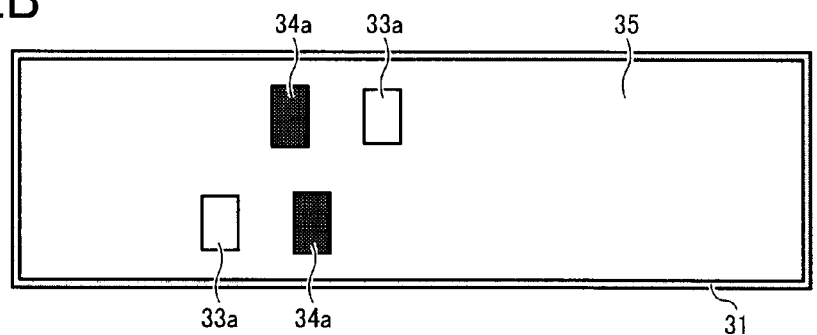
Figure 32C:
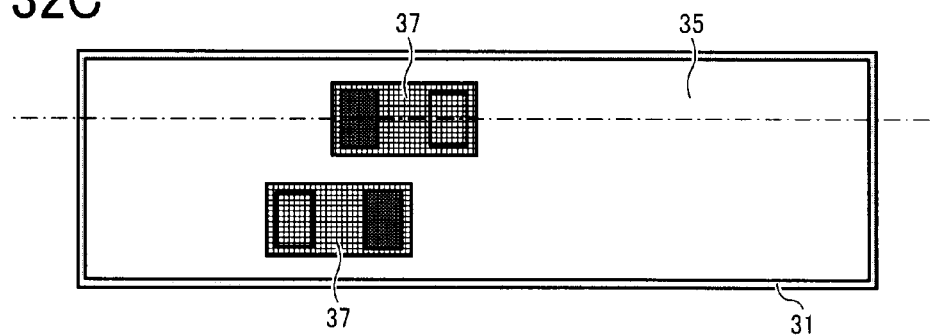
Figure 32D:
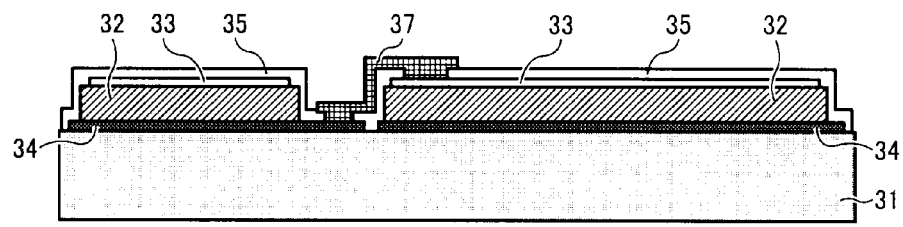

FIG. 30 is a perspective view illustrating the entire of the eighth example of the deflecting mirror. FIG. 31A is a schematic plan view illustrating a pair of driving beam members for driving the deflecting mirror, and FIG. 31B is a schematic side view for explaining an example of applying a voltage to the driving beam members.

The eighth example is a modified version of the fifth to seventh examples, and produces the effects of the fifth to seventh examples.

As illustrated in FIG. 31, the piezoelectric material layers 32 are formed on substantially the entire surface of the driving beam members 30. The piezoelectric material layers 32 are separated at the reverse wiring portion Rp, which is apart from the second end of each of the driving beam members 30 connected with the torsion bar spring 20 by Lp (which is equal to 2L/3). In this regard, the first piezoelectric material layers extending from the first end of each driving beam member have a length of L/3, and the second piezoelectric material layers extending from the second end of each driving beam member have a length of 2L/3.

FIG. 32 is a schematic view for explaining the structure of the reverse phase wiring portion Rp of the driving beam member illustrated in FIG. 31. Specifically, FIG. 32A is a plan view of the reverse phase wiring portion Rp in which the lower electrodes 34, piezoelectric material layers 32 and upper electrodes 33 are formed on the support beam member 31. FIG. 32B is a view of the reverse phase wiring portion Rp in which the insulating layer 35 is further formed on the upper and lower electrodes 33 and 34. FIG. 32C is a view of the reverse phase wiring portion Rp in which the wires 37 are arranged on the land portions 33a and 34a of the upper and lower electrodes 33 and 34. FIG. 32D is a cross sectional view of the reverse phase wiring portion Rp illustrated in FIG. 32C when the driving beam member is cut at a chain line.

Specifically, as illustrated in FIGS. 32A-32D, the wire 37 is arranged from the land portion 33a of the upper electrode 33 to the land portion 34a of the lower electrode 34, and from the land portion 34a to the land portion 33a so that opposite driving voltages are applied to the piezoelectric material layers 32 separated at the reverse phase wiring portions Rp. By using such driving beam members, a driving force which is a combination of the driving forces in the fifth to seventh examples can be generated. Namely, a larger driving force can be generated.

Figure 33:
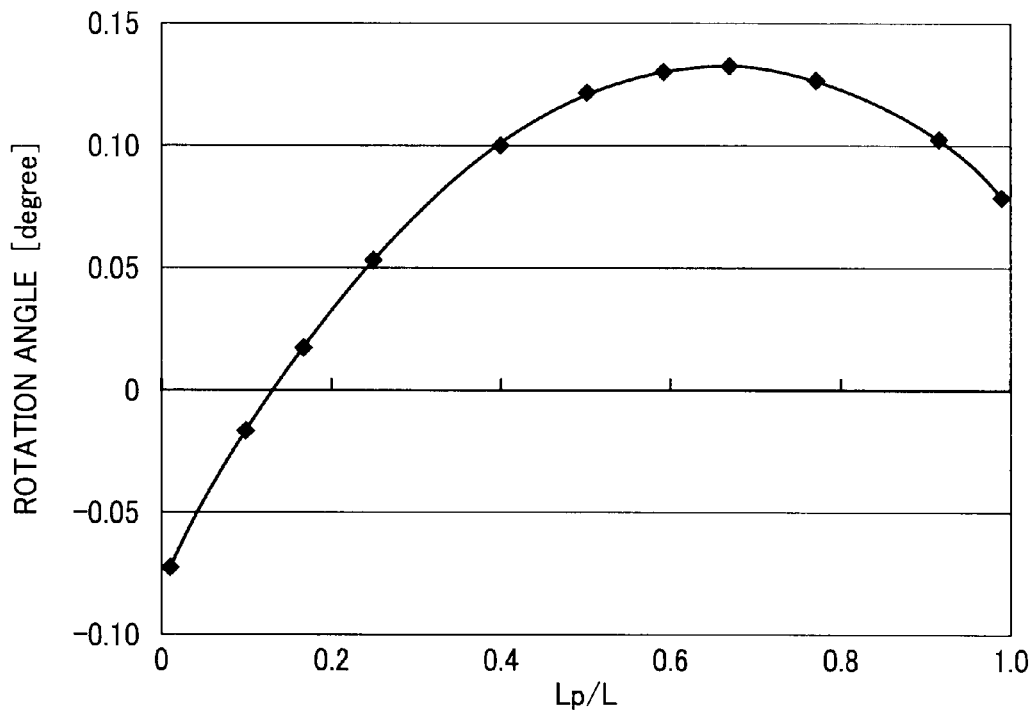
FIG. 33 is a graph illustrating a simulation result showing the rotation angle of the pair of driving beam members illustrated in FIG. 31 at the junction (i.e., second end) thereof with the torsion bar spring.
Figure 34:
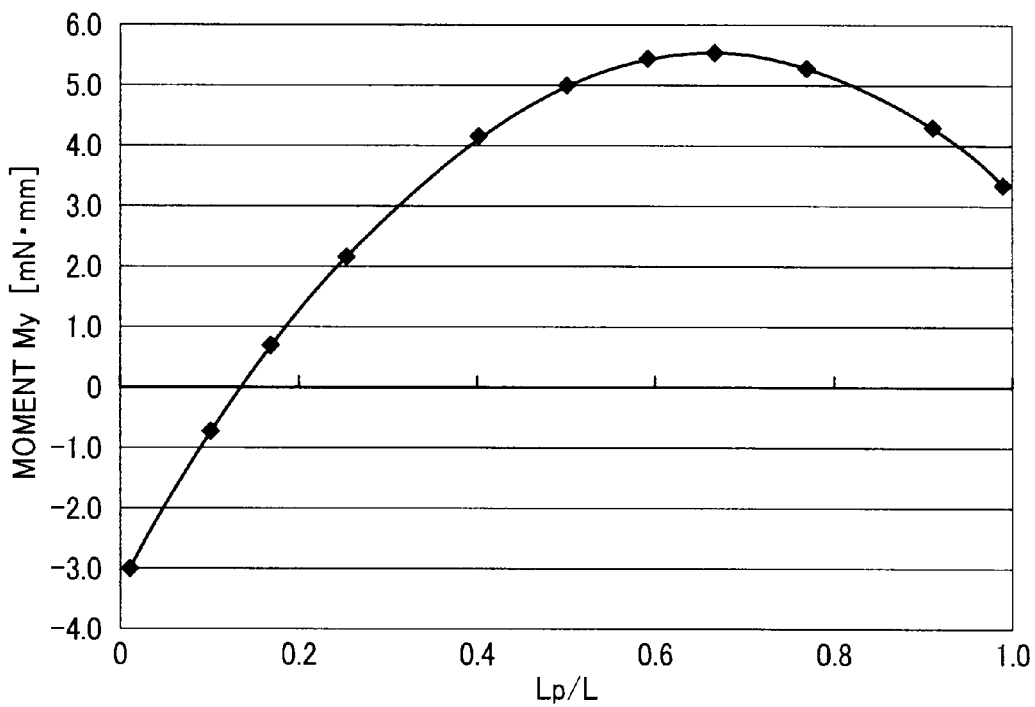
FIG. 34 is a graph showing the simulated relationship between the ratio (Lp/L) and the moment generated when the driving beam members illustrated in FIG. 31 are prevented from bending.

The results of the simulation of bending of a pair of driving beam members which is modeled such that both ends thereof are fixed and the structure thereof is unimorph structure are illustrated in FIG. 33. In the driving beam member illustrated in FIG. 33, the pair of driving beam members is freely deformed without applying load to the center thereof. In FIG. 33, the ratio (Lp/L) of the length (Lp) of the longer piezoelectric material layer 32 to the length (L) of each of the pair of driving beam member 30 is plotted on the X-axis, and the rotation angle of the pair of driving beam members is plotted on the Y-axis. It is clear from FIG. 33 that the maximum rotation angle is maximized when the ratio (Lp/L) is 0.66. FIG. 34 illustrates the moment of the pair of driving beam members generated when deformation of the center portion thereof is prevented. Similarly to the curve of FIG. 33, the curve of FIG. 34 is maximized when the ratio is 0.66. It is clear that the amounts of deformation and reaction force are greater than those in the fifth to seventh examples.

Example 9

In Example 9, a deflecting mirror, which is driven by a reverse-phase driving method and in which first and second piezoelectric material layers respectively have lengths of ⅔L and ⅓L and used for the purpose of driving and detecting respectively are arranged, will be explained.

When a reflecting mirror is used under actual environmental conditions, a problem in that the resonance frequency or amplitude of the reflecting mirror varies depending on the variables such as rigidity of the torsion bar spring, weight of the mirror, manufacturing errors of parts, and environmental temperature is caused. In order to prevent occurrence of the problem, it is preferable to detect the movement of the mirror to control the movement.

In this ninth example, the movement of the deflecting mirror is detected.

Figure 35:
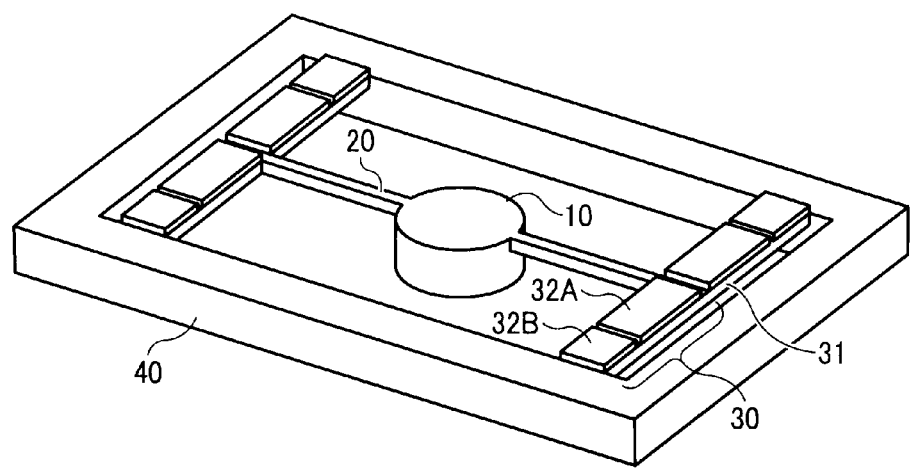
FIG. 35 is a perspective view illustrating another example of the deflecting mirror of the present invention.
Figure 36A:
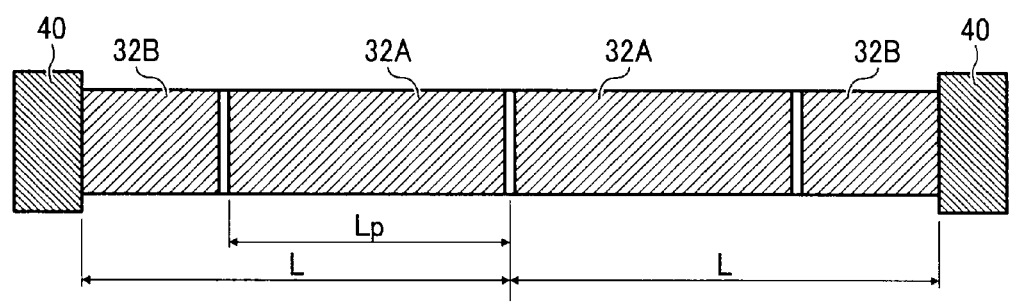
FIG. 36A illustrates a pair of driving beam members of the deflecting mirror illustrated in FIG. 35.
Figure 36B:
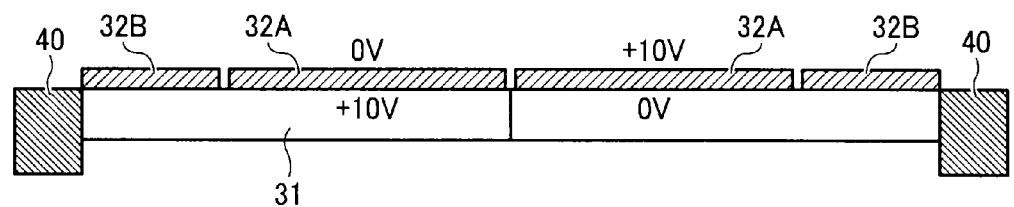
FIG. 36B is a side view of the driving beam members illustrated in FIG. 36A for explaining an example of applying voltage thereto.

FIG. 35 is a perspective view illustrating the entire of the ninth example of the deflecting mirror. FIG. 36A is a schematic plan view illustrating a pair of driving beam members for driving the deflecting mirror, and FIG. 36B is a schematic side view for explaining an example of applying a voltage to the driving beam members.

The structure of the ninth example of the deflecting mirror is similar to those of the first to eighth examples except that the configuration of the piezoelectric material layer 32 is different.

As illustrated in FIGS. 35 and 36, the piezoelectric material layer 32 is arranged on substantially the entire portion of the driving beam member 30. At a point of each driving beam member 30 apart by Lp (=2L/3) from the second end of the driving beam member connected with the torsion bar spring 20, the piezoelectric material layer 32 is separated into first and second piezoelectric material layers 32A and 32B. In this regard, a wire is arranged from the second piezoelectric material layer 32B to the fixed base 40 while passing along the first piezoelectric material layer 32A without contacting the first piezoelectric material layer. A driving voltage is applied to the first piezoelectric material layer 32A to vibrate the mirror 10. Piezoelectric materials have properties such that when a voltage is applied thereto, the piezoelectric materials are deformed, and by deforming the piezoelectric materials, a voltage is generated. Therefore, when the driving beam member 30 is deformed by applying a voltage to the first piezoelectric material layer 32A, a voltage is generated between the upper electrode 33 and the lower electrode 34 of the second piezoelectric material layer 32B. By detecting the thus generated voltage, the degree of deformation of the driving beam member 30 can be determined.

In this ninth example, deformation of the same driving beam member can be detected. Therefore, a signal corresponding to the real deformation of the driving beam member can be obtained. This detection signal corresponds to the movement of the mirror (i.e., scanned light), and therefore the signal can be used as a synchronization signal in image forming apparatus and image projecting apparatus. In order to determine the timing of scanning light, methods in which a light sensitive element is arranged at a point on the light scanning path are typically used. By using this deflecting mirror, it is not necessary to set such a light sensitive element, and thereby the apparatus can be miniaturized and the manufacturing costs of the apparatus can be reduced. In addition, when a light sensitive element is arranged at a point on the light scanning path, a problem in that the scanning range is narrowed is caused. However, by using this deflecting mirror, movement of scanning light can be detected without narrowing the light scanning range.

Figure 37A:
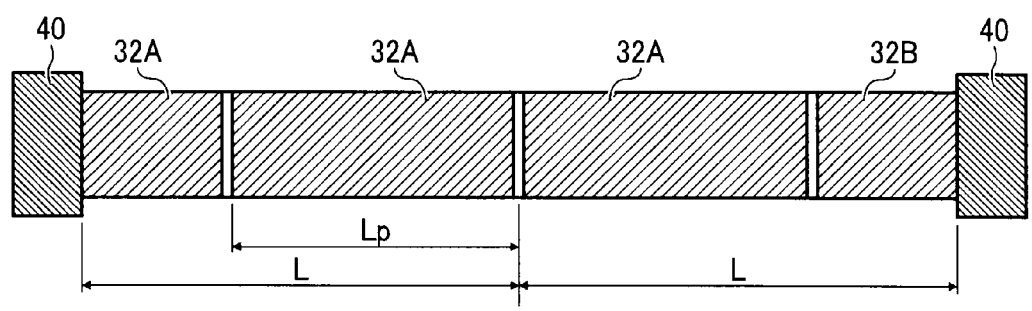
FIG. 37A illustrates another pair of driving beam members of the deflecting mirror illustrated in FIG. 35.
Figure 37B:
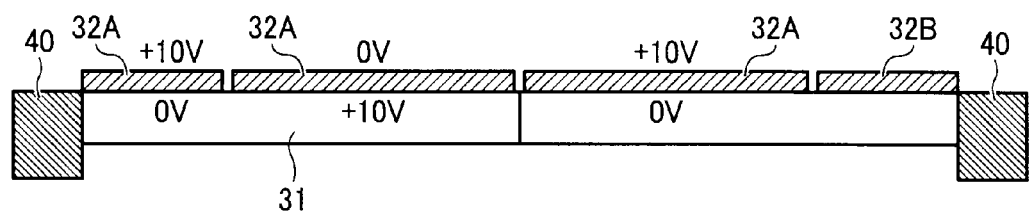
FIG. 37B is a side view of the driving beam members illustrated in FIG. 37A for explaining an example of applying voltage thereto.

Further, when it is desired to obtain a large amplitude, a method in which only one of the second piezoelectric material layers 32B is used for detecting deformation of the driving beam member as illustrated in FIG. 37 can be used. Since the detected signal increases as the degree of deformation increases, a strong signal can be detected in the deflecting mirror having such configuration as illustrated in FIG. 37.

In the first to ninth examples of the deflecting mirror, a torsion bar spring is used as the elastic member supporting the mirror 10. However, elastic members utilizing bending instead of torsion can also be used as the elastic member.

Example 10

In Example 10, a deflecting mirror, which is driven by a uniaxial in-phase driving method and in which first and second piezoelectric material layers separated from each other at the center of the driving beam member are driven by driving signals having opposite phases, will be explained.

A tenth example of the deflecting mirror of the present invention, which deflects light in one direction, will be explained by reference to FIGS. 44-47.

Figure 44:
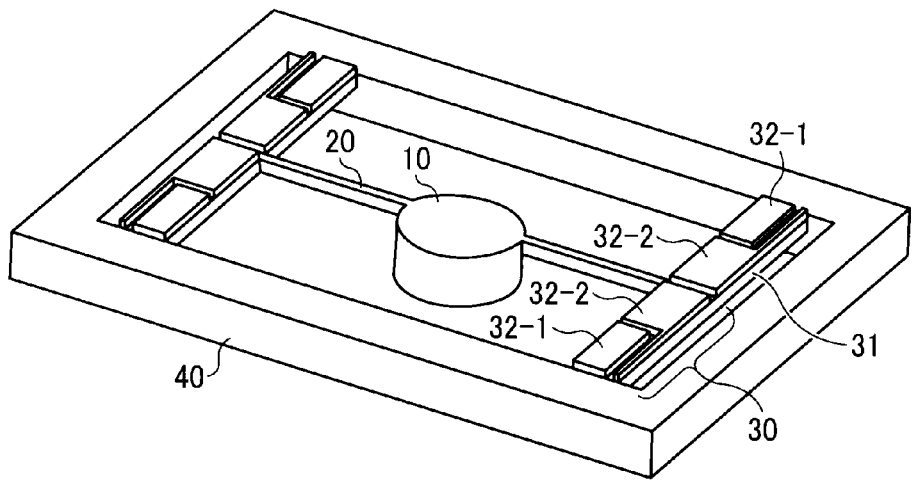
FIG. 44 is a perspective view illustrating another example of the deflecting mirror of the present invention.
Figure 45A:
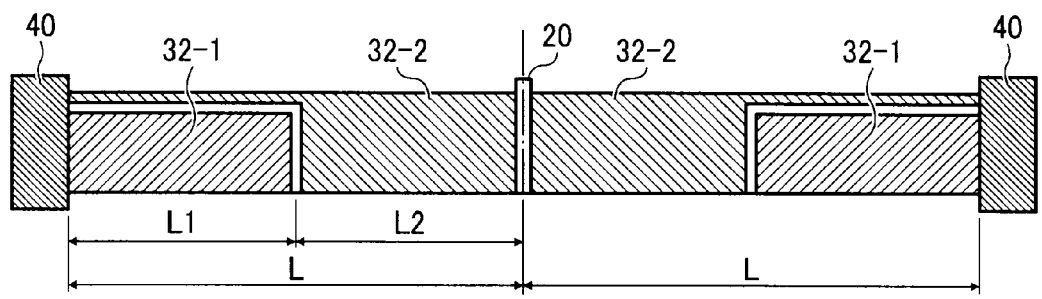
FIG. 45A illustrates a pair of driving beam members of the deflecting mirror illustrated in FIG. 44.
Figure 45B:
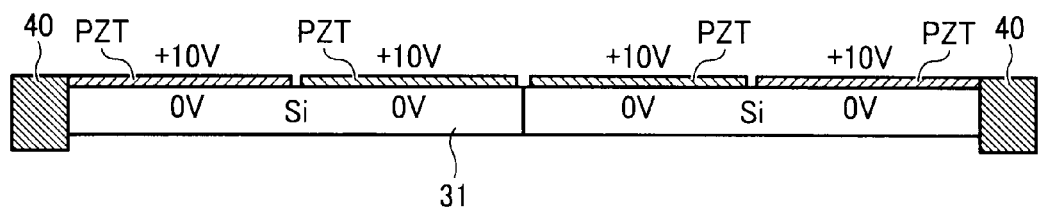
FIG. 45B is a side view of the driving beam members illustrated in FIG. 45A for explaining an example of applying voltage thereto.

FIG. 44 is a perspective view illustrating the entire of the tenth example of the deflecting mirror. FIG. 45A is a schematic plan view illustrating a pair of driving beam members for driving the deflecting mirror, and FIG. 45B is a schematic side view for explaining an example of applying a voltage to the driving beam members.

Referring to FIG. 44, the deflecting mirror includes the mirror 10 having a reflection surface from which light is reflected; and the torsion bar spring 20, which is an elastic support member and which is connected with the mirror 10 in such a manner that the axis of the torsion bar spring passes through the mirror 10 while being apart from the center of gravity of the mirror by ΔS.

Each of the two ends of the torsion bar spring 20 opposite to the ends thereof connected with the mirror 10 is connected with the second ends of the two driving beam members 30. The other end (first end) of each of the driving beam members is connected with the fixed base 40. The driving beam members 30 are set so as to be substantially perpendicular to the torsion bar spring 20. As illustrated in FIG. 44, the two driving beam members are arranged at each of the ends of the torsion bar spring 20.

In this tenth example of the deflecting mirror, the mirror 10, torsion bar spring 20 and driving members 30 are integrally formed using a MEMS (micro electro mechanical systems) process. The mirror 10 has a configuration such that a thin film of a metal such as aluminum is formed on a surface of a silicon board, resulting in formation of a reflection surface. The driving beam members have a flat plate form and a unimorph structure such that first and second piezoelectric material layers 32-1 and 32-2 are overlaid on one surface of the support beam member 31.

As the portion having a unimorph structure is thinner, the support beam member 31 can be deformed more easily. However, when the mirror 10 is too thin, the reflection surface is easily deformed, thereby deteriorating the optical properties of the wave front of the mirror. Therefore, the deflecting mirror of the present invention is prepared by a method in which a silicon on insulator (SOI) wafer is used, the support beam member is constituted of only the active layer so as to be thin, and the mirror has the same thickness as the combination of the active layer and support substrate of the SOI wafer. In this example, the active layer has a thickness of 0.05 mm and the support substrate has a thickness of 0.3 mm. In addition, the torsion bar spring 20 has the same thickness as the active layer of the SOI wafer, but is not limited thereto. The thickness of the torsion bar spring 20 may be the same as the thickness of the support substrate or the thickness of the combination of the active layer and the support substrate. The thickness is determined depending on the required resonance frequency and the layout designability.

The structure of the driving beam member 30 will be explained in detail. The structure of the driving beam member 30 is similar to that of the first example illustrated in FIG. 3. Specifically, the adhesive layer 36, lower electrode 34, piezoelectric material layer 32, and upper electrode 33 are formed on the support beam member 31 by sputtering. These layers are subjected to etching so that necessary portions thereof remain. The adhesive layer 36 is made of titanium (Ti), the upper and lower electrodes are made of platinum (Pt), and the piezoelectric material layer is made of lead titanate zirconate (PZT). By wiring land portions 33a and 34a of the upper and lower electrodes and applying a voltage thereto, the piezoelectric material layer 32 expands and contracts along the surface of the support beam member 31, and thereby the driving beam members are deformed (warped). By applying a same-direction voltage to each of the piezoelectric material layers 32 of the driving beam members 30 as illustrated in FIG. 45B to subject the driving beam members to in-phase driving, the junction of the driving beam members and the torsion bar spring 20 is driven in the direction perpendicular to the reflection surface of the mirror 10.

The deflecting mirror of this tenth example has a vibration mode such that the mirror 10 is rotated on a rotation axis parallel to the axis of the torsion bar spring 20. The resonance frequency thereof is determined depending on the rigidity of the torsion bar sprint 20 and the inertia moment of the mirror 10. Strictly speaking, the resonance frequency of the mirror 10 in the rotation mode is influenced by the rigidity of the driving beam member.

By driving the driving beam members 30 by a sinusoidal wave (for example, a driving signal illustrated in FIG. 46) or a pulse wave having a frequency close to the resonance frequency in the rotation mode, the junction of the driving beam members 30 and the torsion bar spring 20 is vibrated up and down as illustrated in FIG. 47. Since the axis of the torsion bar spring 20 is apart from the center of gravity of the mirror 10, the mirror is activated so as to have a rotation mode by the vibration of the junction of the driving beam members 30 and the torsion bar spring 20. Therefore, the mirror 10 has large rotation amplitude even though the driving power is small.

As illustrated in FIG. 45, the piezoelectric material layer is arranged on substantially the entire portion of the driving beam member, and is separated at substantially the center of the driving beam member, i.e., the first piezoelectric material layer 32-1 located on the fixed base side and the second piezoelectric material layer 32-2 located on the torsion bar spring side are formed. In this regard, the first and second piezoelectric material layers 32-1 and 32-2 are wired separately so that driving signals (driving voltage) can be separately sent to the first and second piezoelectric material layers. In FIG. 45A, the wire of the second piezoelectric material layer 32-2 extends along the first piezoelectric material layer 32-1, but the wire may be arranged so as to extend over the first piezoelectric material layer.

Figure 46:
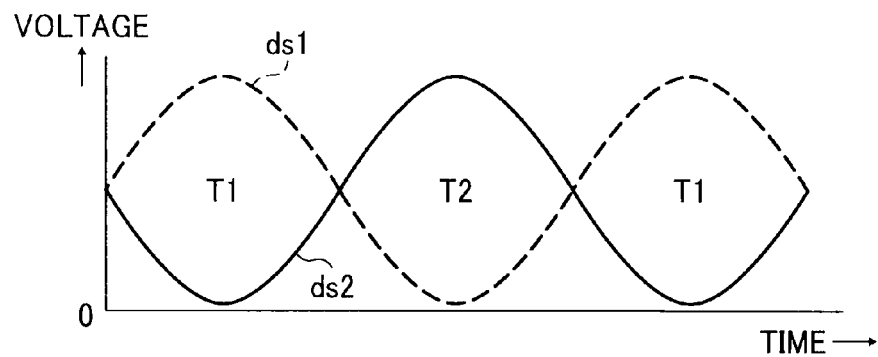
FIG. 46 illustrates an example of driving signal for driving the deflecting mirror illustrated in FIG. 44.
Figure 47A:
FIGS. 47A and 47B illustrate the deflecting mirror illustrated in FIG. 44, which is bent according to driving signals.
Figure 47B:
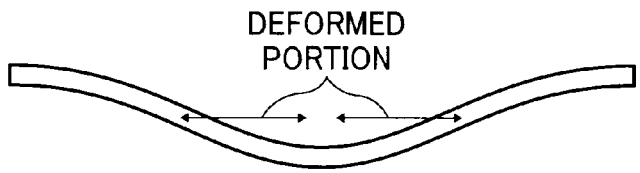

Before driving the mirror 10, the first and second piezoelectric material layers 32-1 and 32-2 are polarized in the same direction as illustrated in FIG. 45B. Next, driving signals ds1 and ds2 having opposite phases as illustrated in FIG. 46 are sent to the first and second piezoelectric material layers 32-1 and 32-2. In this case, the first and second piezoelectric material layers are alternately deformed, and thereby the driving beam members are bent as illustrated in FIGS. 47A and 47B. Therefore, scanning of the mirror 10 can be efficiently performed. In FIG. 45A, characters L1 and L2 denote lengths of the first and second piezoelectric material layers, respectively.

Example 11

In Example 11, a deflecting mirror, which is driven by a uniaxial in-phase driving method and in which first and second piezoelectric material layers separated from each other at substantially the center of the driving beam member are driven by driving signals having the same phase, will be explained.

An eleventh example of the deflecting mirror of the present invention will be explained by reference to FIGS. 48-51.

Figure 48:
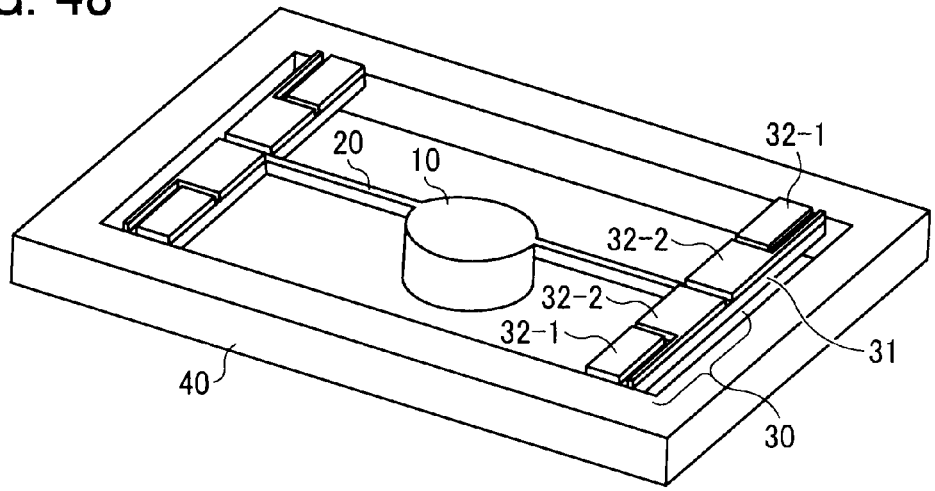
FIG. 48 is a perspective view illustrating another example of the deflecting mirror of the present invention.
Figure 49A:
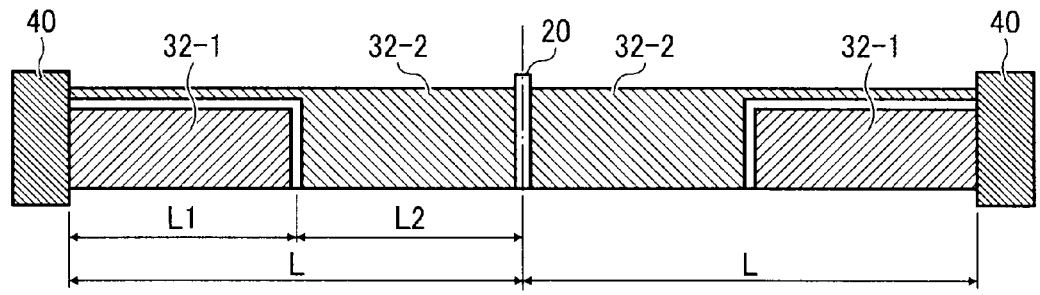
FIG. 49A illustrates a pair of driving beam members of the deflecting mirror illustrated in FIG. 48.

FIG. 48 is a perspective view illustrating the entire of the eleventh example of the deflecting mirror. FIG. 49A is a schematic plan view illustrating a pair of driving beam members for driving the deflecting mirror, and FIG. 49B is a schematic side view for explaining an example of applying a voltage to the driving beam members.

The eleventh example is a modified version of the tenth example, and the separated piezoelectric material layers are driven by signals having the same phases.

The structure of the eleventh example of the deflecting mirror is the same as that of the tenth example, but the polarizing method of the piezoelectric material layers and the driving method for driving the driving beam members are different therefrom.

Figure 49B:
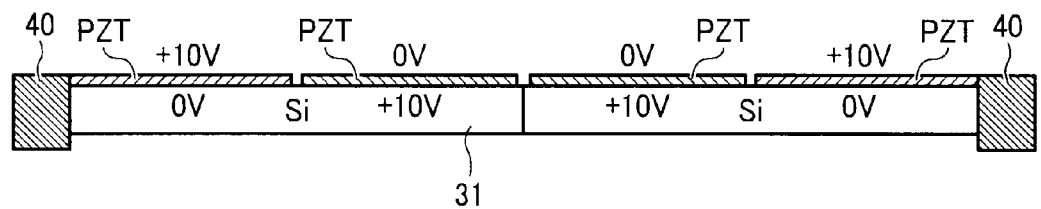
FIG. 49B is a side view of the driving beam members illustrated in FIG. 49A for explaining an example of applying voltage thereto.
Figure 50:
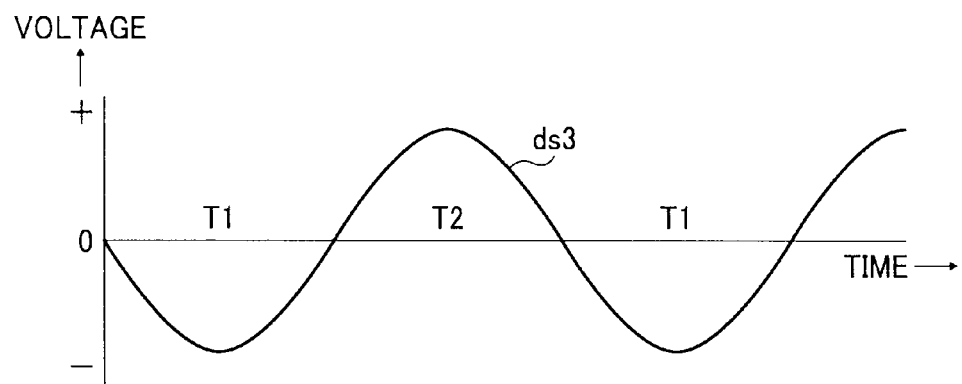
FIG. 50 illustrates an example of driving signal for driving the deflecting mirror illustrated in FIG. 48.
Figure 51A:
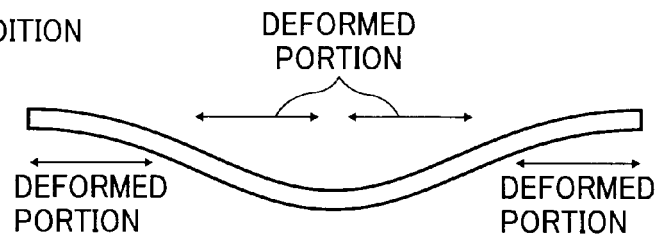
FIGS. 51A and 51B illustrate the deflecting mirror illustrated in FIG. 48, which is bent according to driving signals.
Figure 51B:
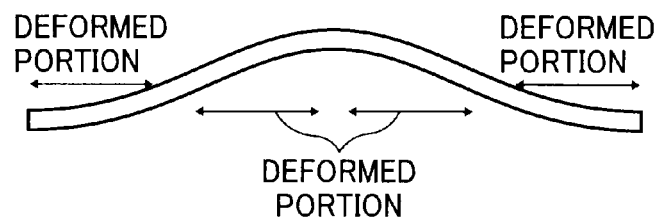

In this eleventh example, before driving the mirror 10, the first and second piezoelectric material layers 32-1 and 32-2 are polarized in the opposite directions as illustrated in FIG. 49B. Next, driving signals ds3 having the same phase as illustrated in FIG. 50 are sent to the first and second piezoelectric material layers 32-1 and 32-2. In this case, the first and second piezoelectric material layers are deformed in the opposite directions. In this case, the driving signals have negative and positive voltages in the periods T1 and T2, respectively. Therefore, the piezoelectric material layers are deformed in the opposite directions, thereby deforming the pair of driving beam members as illustrated in FIG. 51. Therefore, scanning of the mirror 10 can be efficiently performed.

Example 12

In Example 12, a deflecting mirror, which is driven by a uniaxial in-phase driving method and in which first and second piezoelectric material layers used for driving and detecting are arranged while separated from each other at substantially the center of the driving beam member, will be explained.

When a reflecting mirror is used under actual environmental conditions, a problem in that the resonance frequency or amplitude of the reflecting mirror varies depending on the variables such as rigidity of the torsion bar spring, weight of the mirror, manufacturing errors of parts, and environmental temperature is caused. In order to prevent occurrence of the problem, it is preferable to detect the movement of the mirror to control the movement.

In this twelfth example, the movement of the deflecting mirror is detected.

Figure 52:
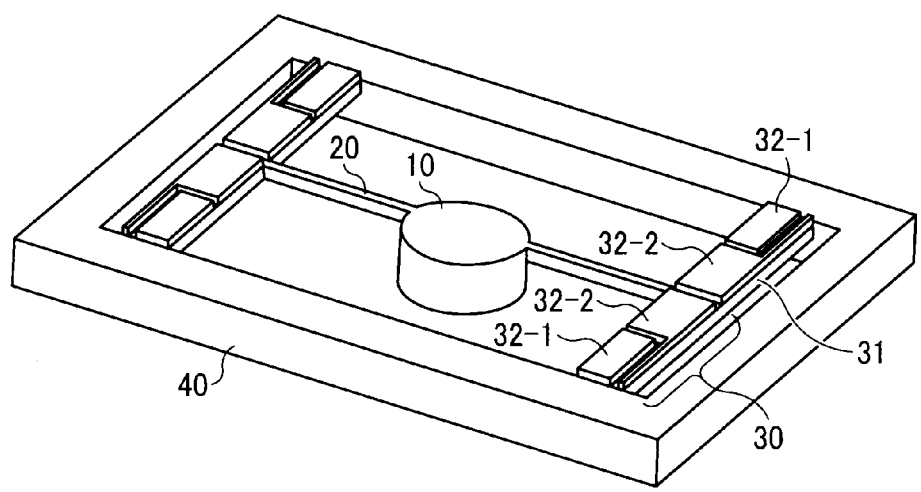
FIG. 52 is a perspective view illustrating another example of the deflecting mirror of the present invention.
Figure 53A:
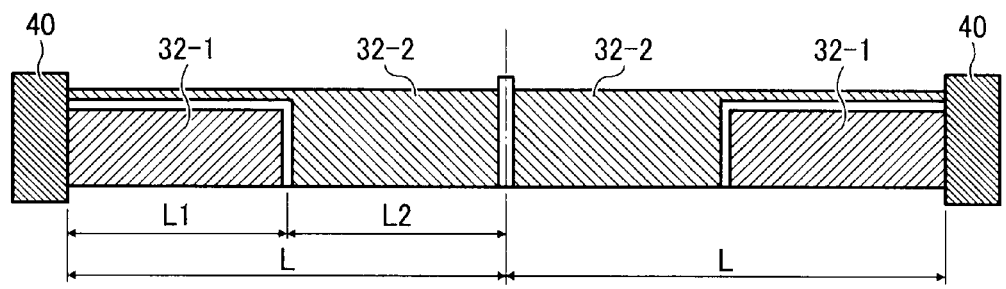
FIG. 53A illustrates a pair of driving beam members of the deflecting mirror illustrated in FIG. 52.

FIG. 52 is a perspective view illustrating the entire of the twelfth example of the deflecting mirror. FIG. 53A is a schematic plan view illustrating a pair of driving beam members for driving the deflecting mirror, and FIG. 53E is a schematic side view for explaining an example of applying a voltage to the driving beam members.

Figure 53B:
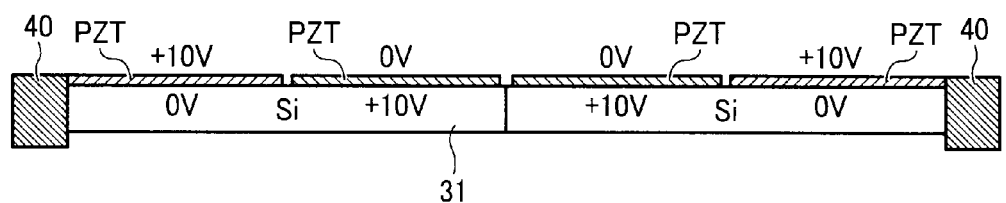
FIG. 53B is a side view of the driving beam members illustrated in FIG. 53A for explaining an example of applying voltage thereto.

The structure of the twelfth example illustrated in FIG. 52 is the same as that of the tenth example, but the structure of the piezoelectric material layers are different therefrom. As illustrated in FIG. 53, the piezoelectric material layer is arranged on substantially the entire portion of the driving beam member. At substantially the center of each driving beam member 30, the piezoelectric material layer is separated into the first and second piezoelectric material layers 32-1 and 32-2.

In this regard, in FIG. 53A a wire is arranged from the second piezoelectric material layer 32-2 to the fixed base 40 while passing along the first piezoelectric material layer 32-1 without contacting the first piezoelectric material layer, but the wire may be located over the first piezoelectric material layer. A driving voltage is applied to the first piezoelectric material layer 32-1 to vibrate the mirror 10. Piezoelectric materials have properties such that when a voltage is applied thereto, the piezoelectric materials are deformed, and by deforming the piezoelectric materials, a voltage is generated. Therefore, when the driving beam member 30 is deformed by applying a voltage to the first piezoelectric material layer 32-1, a voltage is generated between the upper electrode 33 and the lower electrode 34 of the second piezoelectric material layer 32-2. By detecting the thus generated voltage, the degree of deformation of the driving beam member 30 can be determined. In the deflecting mirror illustrated in FIG. 53, the first and second piezoelectric material layers are used for driving and detecting, respectively. However, the first and second piezoelectric material layers are used for detecting and driving, respectively.

In this twelfth example, deformation of the same driving beam member can be detected. Therefore, a signal corresponding to the real deformation of the driving beam member can be obtained. This detection signal corresponds to the movement of the mirror (i.e., scanned light), and therefore the signal can be used as a synchronization signal in image forming apparatus and image projecting apparatus. In order to determine the timing of scanning light, methods in which a light sensitive element is arranged at a point on the light scanning path are typically used. By using this deflecting mirror, it is not necessary to set such a light sensitive element, and thereby the apparatus can be miniaturized and the manufacturing costs of the apparatus can be reduced. In addition, when a light sensitive element is arranged at a point on the light scanning path, a problem in that the scanning range is narrowed is caused. However, by using this deflecting mirror, movement of scanning light can be detected without narrowing the light scanning range.

Example 13

In Example 13, a deflecting mirror, which is driven by a uniaxial reverse-phase driving method and in which first and second piezoelectric material layers are arranged while separated at the one third point apart from the second end of each driving beam member by one third of the length of the driving beam member (i.e., L2/L=⅓), and the first and second piezoelectric material layers are driven by driving signals having opposite phases, will be explained.

The thirteenth example will be explained by reference to FIGS. 54-57.

Figure 54:
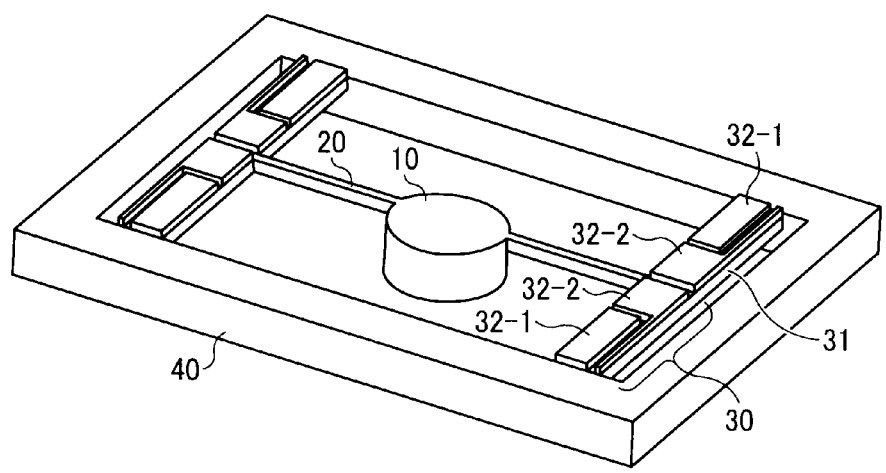
FIG. 54 is a perspective view illustrating another example of the deflecting mirror of the present invention.
Figure 55A:
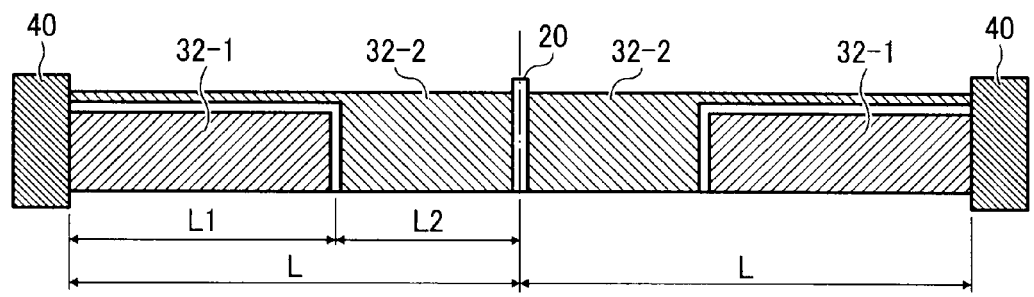
FIG. 55A illustrates a pair of driving beam members of the deflecting mirror illustrated in FIG. 54.
Figure 55B:
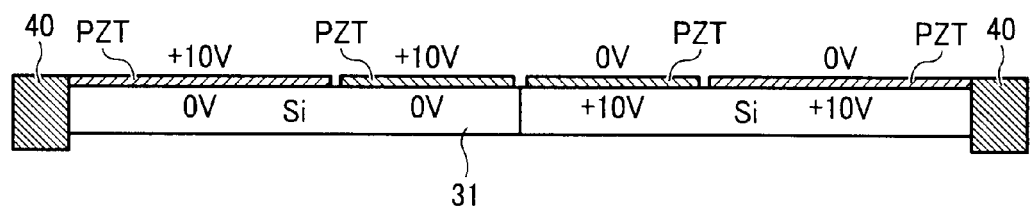
FIG. 55B is a side view of the driving beam members illustrated in FIG. 55A for explaining an example of applying voltage thereto.
Figure 56:
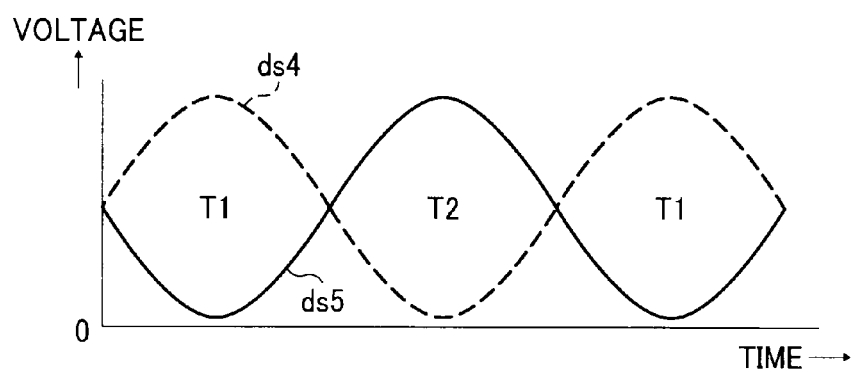
FIG. 56 illustrates an example of driving signal for driving the deflecting mirror illustrated in FIG. 54.

FIG. 54 is a perspective view illustrating the entire of the thirteenth example of the deflecting mirror. FIG. 55A is a schematic plan view illustrating a pair of driving beam members for driving the deflecting mirror, and FIG. 55B is a schematic side view for explaining an example of applying a voltage to the driving beam members.

In this thirteenth example, the rotation axis of the torsion bar spring serving as a support member is driven from both sides thereof in the opposite directions by the driving beam members, resulting in impartment of a torque, thereby driving the reflecting mirror.

The deflecting mirror illustrated in FIG. 54 includes the mirror 10 having a reflection surface from which light is reflected; and the torsion bar spring 20, which is an elastic support member and which is connected with the mirror 10 in such a manner that the axis of the torsion bar spring passes through the center of gravity of the mirror 10. The end of the torsion bar spring 20 opposite to the end on the mirror side is connected with the second end of the driving beam member 30, the other end (first end) of which is connected with the fixed base 40. As illustrated in FIGS. 55A and 55B, the driving beam members 30 are arranged on both sides of the torsion bar spring 20 while extending in a direction perpendicular to the axis of the torsion bar spring.

The driving beam member 30 has a unimorph structure in that the piezoelectric material layer 32 is formed on one side of the support beam member 31. Similarly to the deflecting mirror of Example 10, the lower electrode 34, piezoelectric material (PZT) layer 32, and upper electrode 33 are formed on the support beam member 31 by sputtering. These layers are subjected to etching so that necessary portions thereof remain. By applying a voltage between the upper electrode and the lower electrode, the piezoelectric material layer 32 expands and contracts along the surface of the beam member due to the piezoelectric property, and thereby the beam member is warped.

In this regard, as illustrated in FIG. 55A, the piezoelectric material layer is arranged on substantially the entire of the driving beam member 30, and is separated into the first piezoelectric material layer 32-1 located on the fixed base side and the second piezoelectric material layer 32-2 located on the torsion bar spring side at a point apart from the second end of each driving beam member by one third of the length of each of the driving beam members (i.e., $L2/L=\frac{1}{3}$). In addition, the first and second piezoelectric material layers are wired differently so that driving signals can be independently sent thereto from the outside of the deflecting mirror. In FIG. 55A, the second piezoelectric material layer 32-2 is wired along the first piezoelectric material layer 32-1 without contacting the first piezoelectric material layer. However, the wire of the second piezoelectric material layer 32-2 may be arranged so as to extend over the first piezoelectric material layer 32-1.

Figure 57A:
FIGS. 57A and 57B illustrate the deflecting mirror illustrated in FIG. 54, which is bent according to driving signals.
Figure 57B:
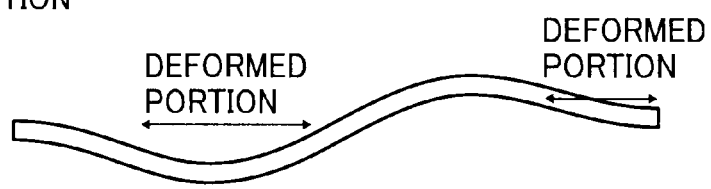

Before driving the mirror 10, the first and second piezoelectric material layers 32-1 and 32-2 are polarized in the same direction as illustrated in FIG. 55B. Next, a driving signal ds5 having a phase (illustrated in FIG. 56) is sent to the left second piezoelectric material layer 32-2 and the right first piezoelectric material layer 32-1 (illustrated in FIG. 55B), and a driving signal ds4 having the opposite phase (illustrated in FIG. 56) is sent to the right second piezoelectric material layer 32-2 and the left first piezoelectric material layer 32-1 (illustrated in FIG. 55B). In this case, the piezoelectric material layers are alternately deformed, and thereby the pair of driving beam members is bent as illustrated in FIGS. 57A and 57B. Therefore, scanning of the mirror 10 can be efficiently performed.

Example 14

In Example 14, a deflecting mirror, which is driven by a uniaxial reverse-phase driving method and in which first and second piezoelectric material layers are arranged while separated at a one third point apart from the second end of each driving beam member by one third of the length of the driving beam member (i.e., $L2/L=\frac{1}{3}$), and the first and second piezoelectric material layers are driven by driving signals having the same phases, will be explained.

This fourteenth example will be explained by reference to FIGS. 58-61.

Figure 58:
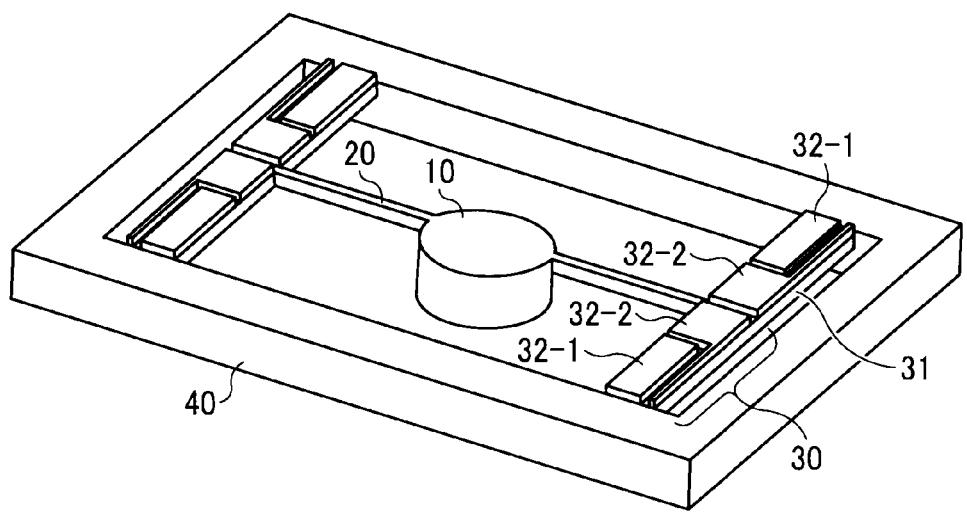
FIG. 58 is a perspective view illustrating another example of the deflecting mirror of the present invention.
Figure 59A:
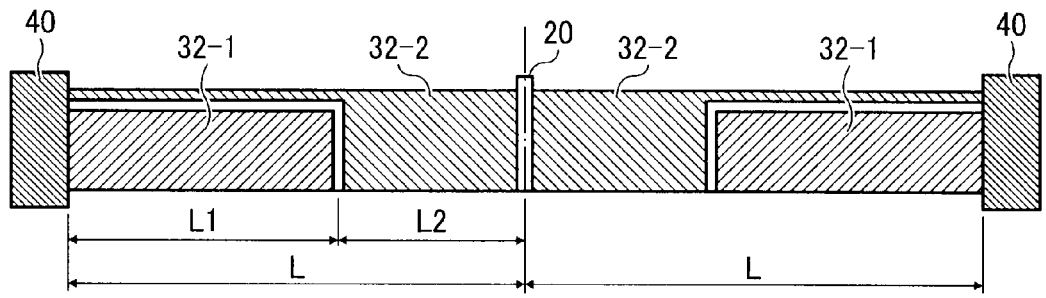
FIG. 59A illustrates a pair of driving beam members of the deflecting mirror illustrated in FIG. 58.

FIG. 58 is a perspective view illustrating the entire of the fourteenth example of the deflecting mirror. FIG. 59A is a schematic plan view illustrating a pair of driving beam members for driving the deflecting mirror, and FIG. 59B is a schematic side view for explaining an example of applying a voltage to the driving beam members.

This fourteenth example is a modified version of the thirteenth example, and the separated piezoelectric material layers are driven by signals having the same phases.

The structure of the fourteenth example of the deflecting mirror illustrated in FIG. 58 is the same as that of the thirteenth example, but the polarizing method of the piezoelectric material layers and the driving method for driving the driving beam member are different therefrom.

Figure 59B:
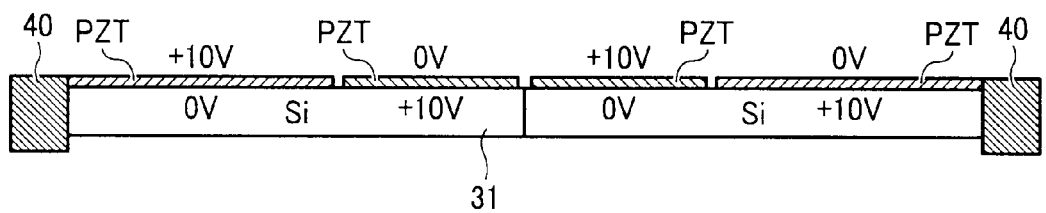
FIG. 59B is a side view of the driving beam members illustrated in FIG. 59A for explaining an example of applying voltage thereto.
Figure 60:
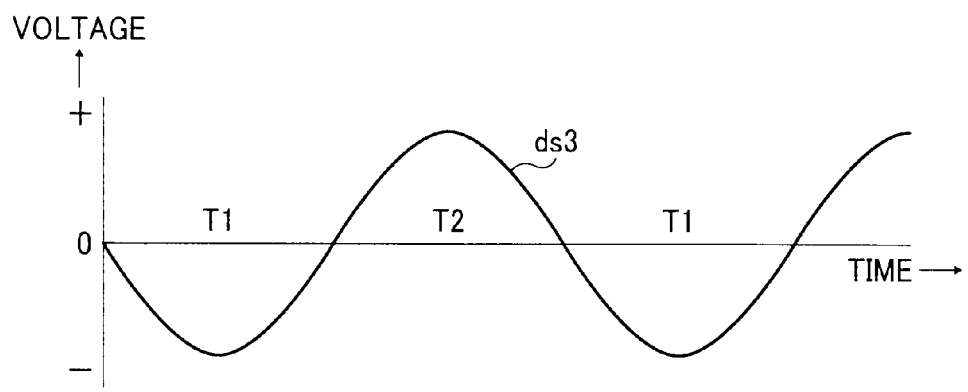
FIG. 60 illustrates an example of driving signal for driving the deflecting mirror illustrated in FIG. 58.
Figure 61A:
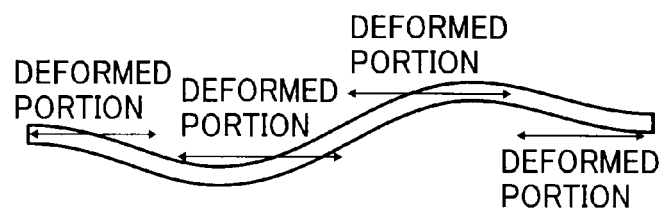
FIGS. 61A and 61B illustrate the deflecting mirror illustrated in FIG. 58, which is bend according to driving signals.
Figure 61B:
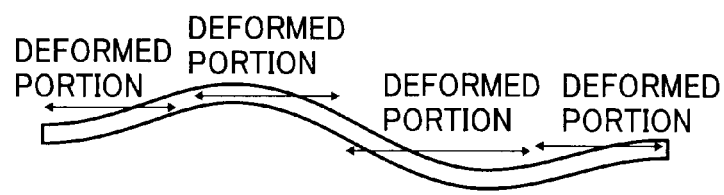

In this fourteenth example, before driving the mirror 10, the first and second piezoelectric material layers 32-1 and 32-2 are polarized in the opposite directions as illustrated in FIG. 59B. In addition, the second piezoelectric material layers 32-2 arranged on the both sides of the torsion bar spring 20 are also polarized in the opposite directions. By sending driving signals ds3 having the same phase as illustrated in FIG. 60 to the first and second piezoelectric material layers 32-1 and 32-2, the first and second piezoelectric material layers are deformed in the opposite directions, thereby deforming the pair of driving beam members as illustrated in FIG. 61. Therefore, scanning of the mirror 10 can be efficiently performed.

Example 15

In Example 15, a deflecting mirror, which is driven by a reverse-phase driving method and in which first and second piezoelectric material layers respectively have lengths of $\frac{1}{3}$L and $\frac{2}{3}$L and used for driving and detecting are arranged, will be explained.

When a reflecting mirror is used under actual environmental conditions, a problem in that the resonance frequency or amplitude of the reflecting mirror varies depending on the variables such as rigidity of the torsion bar spring, weight of the mirror, manufacturing errors of parts, and environmental temperature is caused. In order to prevent occurrence of the problem, it is preferable to detect the movement of the mirror to control the movement.

In this fifteenth example, the movement of the deflecting mirror is detected.

Figure 62:
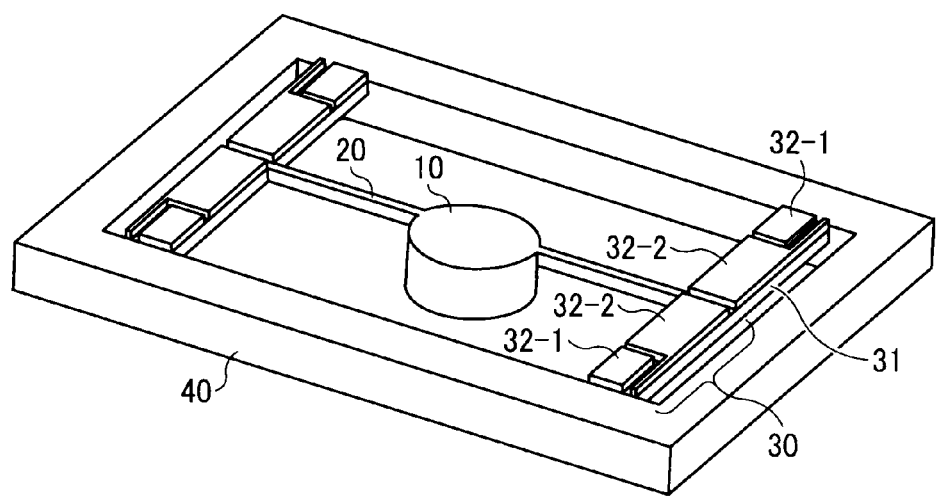
FIG. 62 is a perspective view illustrating another example of the deflecting mirror of the present invention.
Figure 63A:
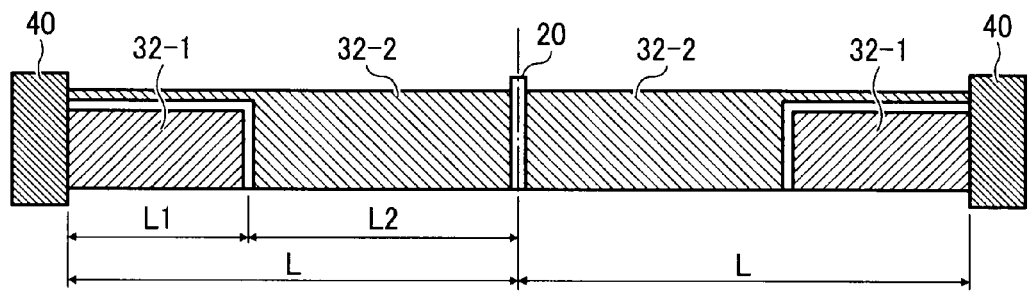
FIG. 63A illustrates a pair of driving beam members of the deflecting mirror illustrated in FIG. 62.
Figure 63B:
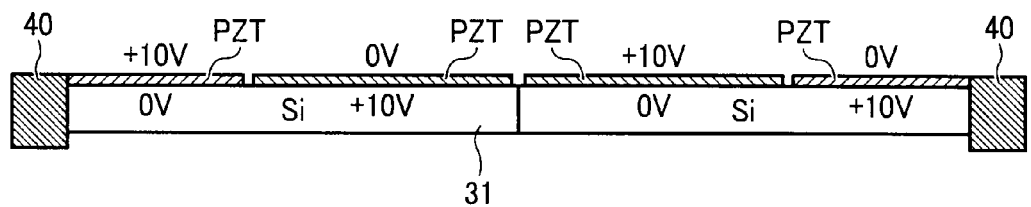
FIG. 63B is a side view of the driving beam members illustrated in FIG. 63A for explaining an example of applying voltage thereto.

FIG. 62 is a perspective view illustrating the entire of the fifteenth example of the deflecting mirror. FIG. 63A is a schematic plan view illustrating a pair of driving beam members for driving the deflecting mirror, and FIG. 63B is a schematic side view for explaining an example of applying a voltage to the driving beam members.

The structure of the fifteenth example of the deflecting mirror illustrated in FIG. 62 is similar to that of the thirteenth example except that the structure of the piezoelectric material layer 32 is different therefrom.

As illustrated in FIG. 63, the piezoelectric material layer is arranged on substantially the entire portion of the driving beam member 30. At a two thirds point of the driving beam member 30 apart by L2 (=2L/3) from the second end of the driving beam member, the piezoelectric material layer 32 is separated into first and second piezoelectric material layers 32-1 and 32-2.

In this regard, a wire is arranged from the second piezoelectric material layer 32-2 to the fixed base 40 while passing along the first piezoelectric material layer 32-1 without contacting the first piezoelectric material layer. Alternatively, a wire may be arranged so as to pass over the first piezoelectric material layer 32-1 without contacting the first piezoelectric material layer. A driving voltage is applied to the second piezoelectric material layer 32-2 to vibrate the mirror 10. Piezoelectric materials have properties such that when a voltage is applied thereto, the piezoelectric materials are deformed, and by deforming the piezoelectric materials, a voltage is generated. Therefore, when the driving beam member 30 is deformed by applying a voltage to the second piezoelectric material layer 32-2, a voltage is generated between the upper electrode 33 and the lower electrode 34 of the first piezoelectric material layer 32-1. By detecting the thus generated voltage, the degree of deformation of the driving beam member 30 can be determined.

In this fifteenth example, deformation of the same driving beam member can be detected. Therefore, a signal corresponding to the real deformation of the driving beam member can be obtained. This detection signal corresponds to the movement of the mirror (i.e., scanned light), and therefore the signal can be used as a synchronization signal in image forming apparatus and image projecting apparatus. In order to determine the timing of scanning light, methods in which a light sensitive element is arranged at a point on the light scanning path are typically used. By using this deflecting mirror, it is not necessary to set such a light sensitive element, and thereby the apparatus can be miniaturized and the manufacturing costs of the apparatus can be reduced. In addition, when a light sensitive element is arranged at a point on the light scanning path, a problem in that the scanning range is narrowed is caused. However, by using this deflecting mirror, movement of scanning light can be detected without narrowing the light scanning range.

In the tenth to fifteenth examples of the deflecting mirror, a torsion bar spring is used as the elastic support member supporting the mirror 10. However, elastic support members utilizing bending instead of torsion can also be used as the elastic support member.

Example 16

In Examples 1-15, the deflecting mirror for deflecting light in one direction has been explained. In Example 16, examples of the optical scanning device (optical writing unit) and image forming apparatus of the present invention using the deflecting mirror will be explained by reference to FIGS. 38-40.

Figure 38:
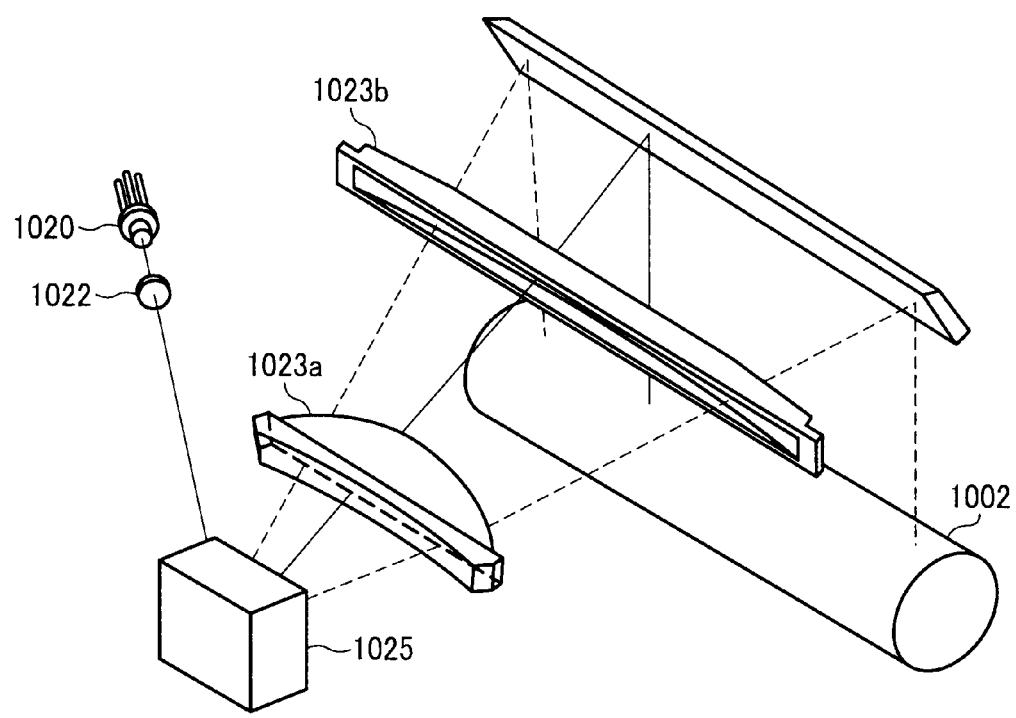
FIG. 38 is a schematic perspective view illustrating an example of the optical scanning device of the present invention.

FIG. 38 illustrates an example of the optical scanning device (optical writing unit) using one of the above-mentioned deflecting mirrors. The optical scanning device has configuration such that laser light emitted from a laser device 1020 and passing through a collimator lens 1022 is deflected by a light deflector 1025 including the deflecting mirror; and the deflected light is guided to a surface of an image bearing member 1002 such as photoreceptors by a scanning lens system including a first lens 1023*a*, a second lens 1023*b*, etc.

Figure 39:
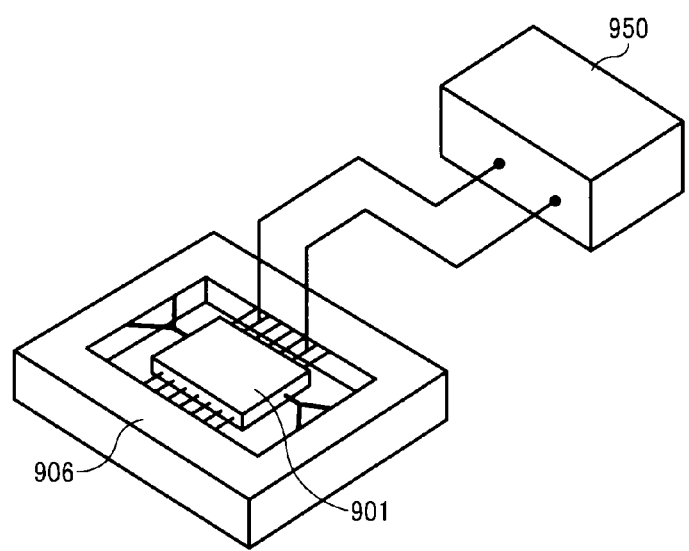
FIG. 39 illustrates a deflecting mirror and a driving device of the optical scanning device illustrated in FIG. 38.

FIG. 39 illustrates an example of the driving device for driving the deflecting mirror. Referring to FIG. 39, a mirror driving device 950 is provided to drive a deflecting mirror 901. The upper and lower electrodes 33 and 34 of the piezoelectric material layers 32 of the driving beam members 30 are electrically connected with the mirror driving device 950. The mirror driving device 950 applies a driving voltage between the upper and lower electrodes 33 and 34 to drive the deflecting mirror. In FIG. 39, numeral 906 denotes a fixed base of the deflecting mirror 901.

The optical scanning device is preferably used for image forming apparatus such as electrophotographic printers and copiers.

Next, an example of the image forming apparatus of the present invention will be explained by reference to FIG. 40.

Figure 40:
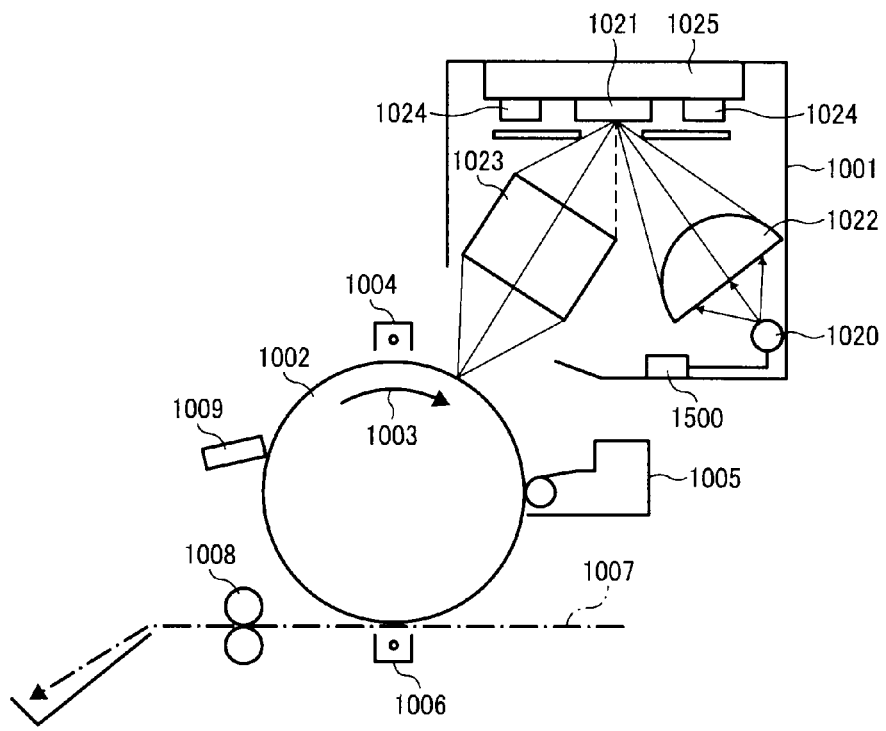
FIG. 40 is a schematic view illustrating an example of the image forming apparatus of the present invention.

Referring to FIG. 40, an optical scanning device 1001 emits a laser beam to scan a surface of the image bearing member 1002 (photoreceptor drum in this case) with the laser beam, resulting in formation of an electrostatic latent image on the image bearing member. The optical scanning device 1001 scans a surface of the photoreceptor drum 1002 with one or plural laser beams, which have been modulated according to recording signals, in a direction parallel to the axis of the photoreceptor drum.

The photoreceptor drum 1002 is rotated in a direction indicated by an arrow 1003, and is charged by a charging device 1004. The optical scanning device scans the thus charged surface of the photoreceptor drum 1002 with the laser beams, resulting in formation of an electrostatic latent image on the photoreceptor drum. The electrostatic latent image is developed with a developing device 1005 using a developer including a toner, thereby forming a toner image on the surface of the photoreceptor drum 1002. The toner image is transferred by a transfer device 1006 to a receiving material 1007. The toner image on the receiving material 1007 is fixed on the receiving material by a fixing device 1008. The surface of the photoreceptor drum 1002 passing the transfer device 1006 is cleaned by a cleaner 1009 to remove residual toner from the surface.

The structure of the image forming apparatus is not limited to the structure illustrated in FIG. 40. For example, belt-form photoreceptors can be used as the image bearing member 1002 instead of the photoreceptor drum. In addition, the image forming apparatus can use an intermediate transfer method in which the toner image formed on the image bearing member is transferred onto an intermediate transfer medium (such as belt-form or drum-form intermediate transfer media), and the toner image is then transferred onto a receiving material, followed by fixing the toner image.

The optical scanning device 1001 includes the light source 1020 emitting one or plural laser beams modulated according to recording signals; a light source driving device 1500 configured to modulate laser beams emitted by the light source; a deflecting mirror 1021, which is the deflecting mirror of the present invention; an optical focusing system 1022 (such as collimator lens systems) configured to focus the modulated laser beams on a surface of the mirror of the deflecting mirror 1021; an optical scanning system 1023 configured to focus the laser beams reflected from the mirror on a surface of the photoreceptor drum 1002; etc. The deflecting mirror 1021 is incorporated in the optical scanning device 1001 while implemented in the circuit board of the light deflector 1025 together with an integrated circuit 1024 for driving the deflecting mirror.

The power consumption of the deflecting mirror 1021 is less than that of a rotating polygon mirror, and therefore the deflecting mirror 1021 is advantageous to image forming apparatus because of saving power. In addition, noise generated when the mirror of the deflecting mirror 1021 vibrates is less than that generated when a polygon mirror rotates, and therefore it is advantageous to use the deflecting mirror to keep the image forming apparatus quiet. Further, the deflecting mirror has such advantages as to occupy much less space than a polygon mirror and to generate a smaller amount of heat than a polygon mirror. Therefore, by using the deflecting mirror, the image forming apparatus can be miniaturized.

Since known devices for use in conventional image forming apparatus can be used for the feeding mechanism for feeding the receiving material 1007, the driving mechanism for driving the photoreceptor drum 1002, the controller for controlling the developing device 1005 and the transfer device 1006, the driving device for driving the light source 1020, etc., the devices are omitted from the figures.

Example 17

In Examples 1-15, the uniaxial deflecting mirror for deflecting light in one direction has been explained. In Example 17, examples of the image projecting apparatus of the present invention using a biaxial deflecting mirror, which deflects light in two directions using the mechanism of the uniaxial deflecting mirror, will be explained by reference to FIGS. 41-43 and 64.

Example 17-1

Figure 41:
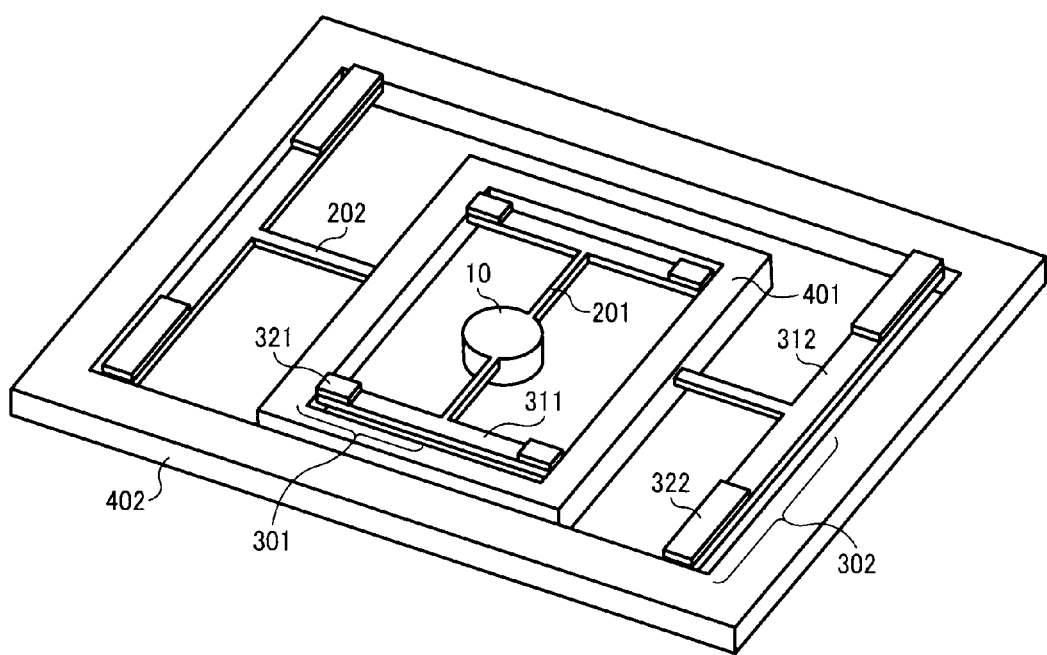
FIG. 41 is a schematic perspective view illustrating an example of the biaxial deflecting mirror of the present invention.

FIG. 41 is a schematic perspective view illustrating a biaxial deflecting mirror, which is an applied example of the deflecting mirror of Example 1.

The deflecting mirror has the mirror 10 having a surface from which light is reflected; and a first torsion bar spring 201, which is an elastic support member supporting the mirror and which is connected with the mirror 10 in such a manner that the axis of the first torsion bar spring passes through the mirror 10 while being apart from the center of gravity of the mirror by ΔS.

Each of the two ends of the first torsion bar spring 201 opposite to the ends thereof connected with the mirror 10 is connected with a first support beam member 311 supporting two first driving beam members 301. One end (first end) of each of the first driving beam members 301 is connected with a movable frame 401. The two first driving beam members 301 are arranged on both sides of the torsion bar spring 201 so as to be substantially perpendicular to the torsion bar spring 201. In addition, a second torsion bar spring 202 is connected with the movable frame 401 so as to be perpendicular to the first torsion bar spring 201.

The other ends of the second torsion bar spring 202 are connected with second support beam members 312, each of which supports two second driving beam members 302 each connected with a fixed base 402. Similarly to the deflecting mirror of Example 1-9, the mirror 10, torsion bar springs 201 and 202, support beam members 311 and 312 supporting the driving beam members 301 and 302, movable frame 401, and fixed base 402 are integrally formed using a MEMS (micro electro mechanical systems) process. Specifically, the deflecting mirror is prepared by a method in which a silicon on insulator (SOI) wafer is used, the driving beam members 301 and 302 are constituted of only the active layer so as to be thin, and the mirror has the same thickness as the combination of the active layer and support substrate of the SOI wafer. In this example, the thickness of the fixed base 402 and the movable frame 401, which are required to have good rigidity, is the same as the thickness of the combination of the active layer and support substrate of the SOI wafer. In addition, the torsion bar springs 201 and 202 have the same thickness as the active layer of the SOI wafer, but may have the same thickness as the combination of the active layer and the fixed base.

In this example, the mirror 10 has a configuration such that a thin film of a metal such as aluminum is formed on a surface of a silicon board, resulting in formation of a reflection surface. The driving beam members 301 and 302 have a flat plate form and a unimorph structure such that piezoelectric material layers 321 and 322 are formed on portions of one side of each of the support beam members 311 and 312, respectively.

Since the deflection mirror has such a configuration, the first piezoelectric material layer 321 on the first driving beam member 301 is driven at a first resonance frequency, which is determined depending on the rigidity of the first torsion bar spring 202 and the inertia moment of the mirror 10, and the second piezoelectric material layer 322 on the second driving beam member 302 is driven at a second resonance frequency, which is determined depending on the rigidity of the second torsion bar spring 201 and the total inertia moment of the mirror 10, first torsion bar spring 201, first driving beam member 301, and movable frame 401, thereby biaxially vibrating the mirror 10.

Example 17-2

Figure 64:
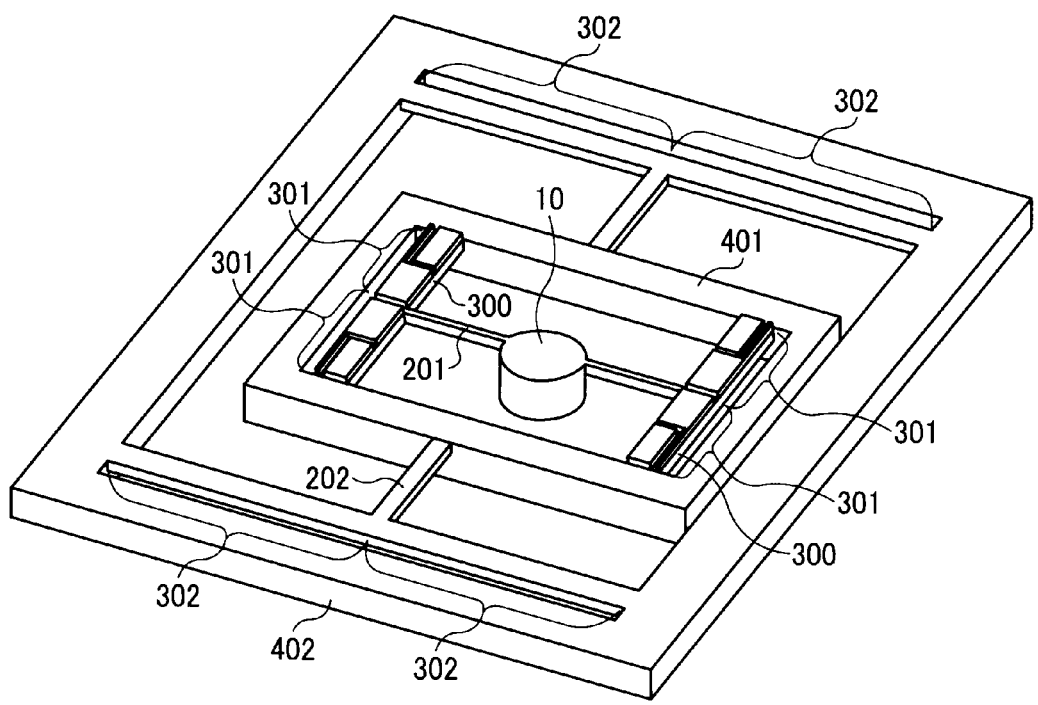
FIG. 64 is a perspective view illustrating another example of the biaxial deflecting mirror of the present invention.

FIG. 64 is a schematic perspective view illustrating another biaxial deflecting mirror, which is an applied example of the deflecting mirror of Example 10, etc.

The deflecting mirror has the mirror 10 having a surface from which light is reflected; and the first torsion bar spring 201, which is an elastic support member supporting the mirror and which is connected with the mirror in such a manner that the axis of the first torsion bar spring passes, through the mirror while being apart from the center of gravity of the mirror by ΔS.

Each of the two ends of the first torsion bar spring 201 opposite to the ends thereof connected with the mirror 10 is connected with the two first driving beam members 301. One end (first end) of each of the first driving beam members 301 is connected with a movable frame 401. The two first driving beam members 301 are arranged on both sides of the torsion bar spring 201 so as to be substantially perpendicular to the torsion bar spring 201. In addition, the second torsion bar spring 202 is connected with the movable frame 401 so as to be perpendicular to the first torsion bar spring 201.

The other ends of the second torsion bar spring 202 are connected with the two second driving beam members 302 each connected with the fixed base 402. Similarly to the deflecting mirror of Example 1-15, the mirror 10, torsion bar springs, driving beam members, movable frame, and fixed base are integrally formed using a MEMS (micro electro mechanical systems) process. Specifically, the deflecting mirror is prepared by a method in which a silicon on insulator (SOI) wafer is used, the driving beam members are constituted of only the active layer so as to be thin, and the mirror has the same thickness as the combination of the active layer and support substrate of the SOI wafer. In this example, each of the fixed base 402 and the movable frame 401, which are required to have good rigidity, has the same thickness as the combination of the active layer and support substrate of the SOI wafer. In addition, each of the torsion bar springs 201 and 202 has the same thickness as the active layer of the SOI wafer, but may have the same thickness as the combination of the active layer and the fixed base.

In this example, the mirror 10 has a configuration such that a thin film of a metal such as aluminum is formed on a surface of a silicon board, resulting information of a reflection surface. The driving beam members 301 and 302 have a flat plate form and a unimorph structure such that piezoelectric material layers are formed on portions of one side of each of support beam members 300, respectively.

Since the deflection mirror has such a configuration, the first piezoelectric material layer on the first driving beam member 301 is driven at a first resonance frequency, which is determined depending on the rigidity of the first torsion bar spring 201 and the inertia moment of the mirror 10, and the second piezoelectric material layer on the second driving beam member 302 is driven at a second resonance frequency, which is determined depending on the rigidity of the second torsion bar spring 201 and the total inertia moment of the mirror 10, first torsion bar spring 201, first driving beam member 301, and movable frame 401, thereby biaxially vibrating the mirror 10.

Example 17-3

Figure 42:
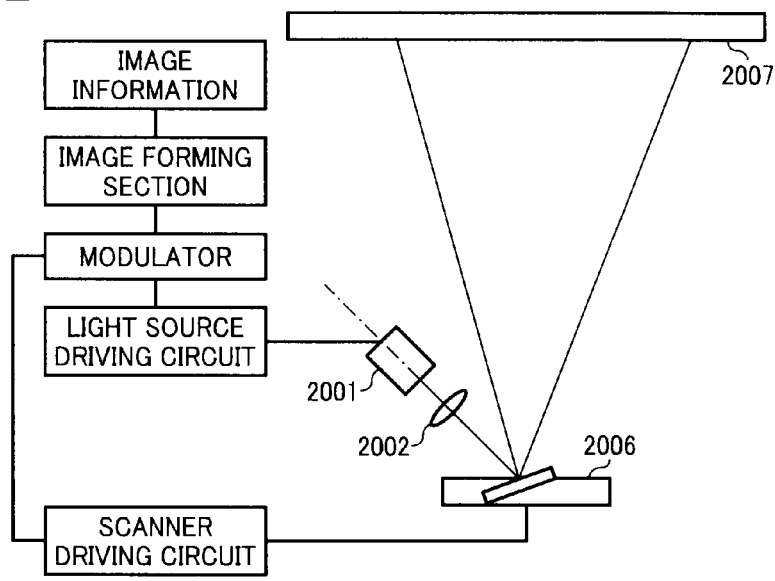
FIG. 42 is a schematic view illustrating an example of the image projecting apparatus of the present invention using the biaxial deflecting mirror illustrated in FIG. 41 or FIG. 64 below.

An example of the image projecting apparatus using the above-mentioned biaxial deflecting mirror will be explained by reference to FIGS. 42 and 43. FIG. 42 is a conceptual diagram of the image projecting apparatus of the present invention, and FIG. 43 is a schematic perspective view thereof.

Figure 43:
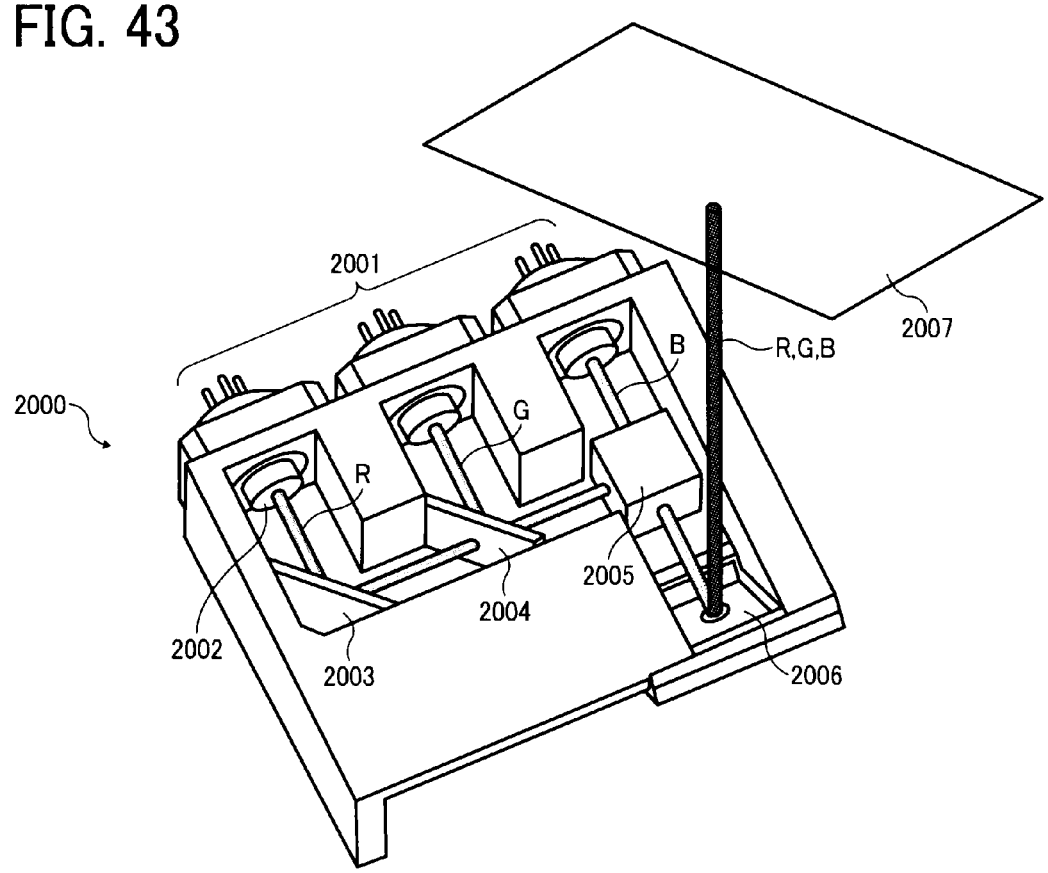
FIG. 43 is a schematic perspective view illustrating the image projecting apparatus illustrated in FIG. 42.

Referring to FIGS. 42 and 43, an image projecting apparatus 2000 includes a laser source 2001 configured to emit red (R), green (G) and blue (B) laser beams having different wavelengths; and condenser lenses 2002, which is located near the light sources and which is configured to change diverging light to substantially parallel light. The parallel R, G and B laser beams enter into a synthesizing prism 2005 via a mirror 2003 and a half mirror 2004 to be synthesized by the synthesizing prism. The synthesized laser beams are then deflected by a deflecting mirror 2006, which is prepared by a MEMS process and which is the biaxial deflecting mirror illustrated in FIG. 41. The deflected laser beams are projected on a screen 2007, resulting in projection of an image. In FIG. 42, the three laser beams, synthesizing prism and mirrors are not illustrated.

In this regard, the deflecting mirror 2006, which can change the reflection angle of light biaxially, causes resonance oscillation at a predetermined frequency (for example, at an angle of about 10 degrees) in two perpendicular directions as illustrated in FIGS. 41 and 64. The biaxial deflecting mirror is not necessarily constituted of one biaxial deflecting mirror, and may be constituted of a combination of two of the uniaxial deflecting mirrors mentioned above in Examples 1-15.

Rotating scanning mirrors such as polygon mirrors can be used for the deflecting device. However, the deflecting mirror of the present invention needs a less driving power than such rotating scanning mirrors. Therefore, power consumption of the image projecting apparatus can be reduced. In addition, noise generated when the mirror of the deflecting mirror vibrates is less than that generated when a rotating scanning mirror rotates, and therefore it is advantageous to use the deflecting mirror to keep the image projecting apparatus quiet. Further, the deflecting mirror has such advantages as to occupy much less space than a polygon mirror and to generate a smaller amount of heat than a polygon mirror. Therefore, by using the deflecting mirror, the image projecting apparatus can be miniaturized.

Referring to FIG. 42, in the image projecting apparatus, image signals are formed in an image forming section according to image information. The image signals are sent to a light source driving circuit and a scanner driving circuit via a modulator. Three laser beams are emitted from the laser light source 2001 while subjected to intensity modulation at a proper time by the light source driving circuit so as to be properly scanned by the deflecting mirror 2006. Therefore, a two-dimensional image is projected on the screen 2007. With respect to the intensity modulation, the pulse width or amplitude is modulated. The thus modulated signals are converted to currents, by which the light source driving circuit drives the laser source 2001.

Hereinbefore, examples of the present invention have been explained. As mentioned above, the deflecting mirror of the present invention can be preferably used for optical scanning devices, image forming apparatus and image projecting apparatus. In addition, the deflecting mirror of the present invention can also be used for barcode scanners, laser radars and the like.

This document claims priority and contains subject matter related to Japanese Patent Applications Nos. 2009-020335 and 2009-256271, filed on Jan. 30, 2009 and Nov. 9, 2009, respectively, incorporated herein by reference.

Having now fully described the invention, it will be apparent to one of ordinary skill in the art that many changes and modifications can be made thereto without departing from the spirit and scope of the invention as set forth therein.

What is claimed as new and desired to be secured by letters patent of the United States is:

1. A deflecting mirror comprising:
   a fixed base member;
   a mirror having a reflection surface;
   a support member configured to swingablly support the mirror;
   a pair of driving beam members, each of which has a first end connected with the fixed base member and a second end connected with the support member to support the support member from both sides thereof; and
   a piezoelectric member fixed to each of the pair of driving beam members and including first and second piezoelectric members, wherein the first piezoelectric member extends from the first end of each driving beam member while having substantially one third or two thirds of a length of the driving beam member, and the second piezoelectric member extends from the second end of each driving beam member while having substantially two thirds or one third of the length of the driving beam member,
   wherein the piezoelectric member and the pair of driving beam members constitute a piezoelectric unimorph or bimorph structure, and
   wherein when a voltage is applied to the piezoelectric member, the pair of driving beam members is driven at a same time in opposite directions, thereby applying a moment to the support member, resulting in swinging of the mirror.

2. The deflecting mirror according to claim 1, wherein voltages having different polarities or periodically changed voltages having different phases are applied to the first and second piezoelectric members.

3. The deflecting mirror according to claim 1, wherein a voltage is applied to the first or second piezoelectric member to drive the pair of driving beam members and to swing the mirror, and wherein a voltage generated by deformation of the other piezoelectric member, to which a voltage is not applied, is detected to detect movement of the mirror.

4. The deflecting mirror according to claim 1, wherein the first and second piezoelectric members are wired independently of each other.

5. The deflecting mirror according to claim 4, wherein the first and second piezoelectric members are polarized in a same direction, and periodically changed voltages having different phases are applied to the first and second piezoelectric members.

6. The deflecting mirror according to claim 4, wherein the first and second piezoelectric members are polarized in opposite directions while the first piezoelectric members of the pair of driving beam members are polarized in opposite directions and the second piezoelectric members of the pair of driving beam members are also polarized in opposite directions, and a same periodically changed voltage is applied to the first-mentioned and second piezoelectric members.

7. The deflecting mirror according to claim 4, wherein a voltage is applied to the first or second piezoelectric member to drive the pair of driving beam members and to swing the mirror, and wherein a voltage generated by deformation of the other piezoelectric member, to which a voltage is not applied, is detected to detect movement of the mirror.

* * * * *